United States Patent
Park et al.

(10) Patent No.: US 7,623,383 B2
(45) Date of Patent: *Nov. 24, 2009

(54) THREE-LEVEL NON-VOLATILE SEMICONDUCTOR MEMORY DEVICES WITH LOWER AND UPPER BIT LINES SHARING A VOLTAGE CONTROL BLOCK

(75) Inventors: Jong Yeol Park, Gyeonggi-do (KR); Min Gun Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/567,960

(22) Filed: Dec. 7, 2006

(65) Prior Publication Data

US 2007/0183203 A1    Aug. 9, 2007

(30) Foreign Application Priority Data

Feb. 2, 2006    (KR) .................. 10-2006-0009931

(51) Int. Cl.
*G11C 16/04* (2006.01)
(52) U.S. Cl. .................. 365/185.17; 365/185.18; 365/185.12
(58) Field of Classification Search ............ 365/187.17, 365/185.18, 185.12, 185.17
See application file for complete search history.

(56) References Cited

U.S. PATENT DOCUMENTS

| | | | | |
|---|---|---|---|---|
| 5,621,684 A * | 4/1997 | Jung | .................. | 365/185.17 |
| 5,625,590 A * | 4/1997 | Choi et al. | .................. | 365/185.17 |
| 5,748,529 A * | 5/1998 | Lee | .................. | 365/185.17 |
| 5,936,890 A * | 8/1999 | Yeom | .................. | 365/185.22 |
| 6,335,881 B2 * | 1/2002 | Kim et al. | .................. | 365/185.18 |
| 6,671,204 B2 * | 12/2003 | Im | .................. | 365/185.12 |
| 6,704,239 B2 * | 3/2004 | Cho et al. | .................. | 365/230.04 |
| 6,847,550 B2 | 1/2005 | Park | | |
| 7,187,584 B2 * | 3/2007 | Chang | .................. | 365/185.17 |
| 7,320,126 B2 | 1/2008 | Chang et al. | | |
| 2001/0000023 A1 | 3/2001 | Kawahara et al. | | |
| 2003/0210576 A1 * | 11/2003 | Hwang et al. | .................. | 365/189.05 |

(Continued)

FOREIGN PATENT DOCUMENTS

JP    2004103657 A    4/2004

(Continued)

*Primary Examiner*—Hoai V Ho
*Assistant Examiner*—Fernando N Hidalgo
(74) *Attorney, Agent, or Firm*—Myers Bigel Sibley & Sajovec

(57) ABSTRACT

A non-volatile semiconductor memory device includes a page buffer comprising a lower latch block and an upper latch block, and a memory array that is connected to the lower latch block via a lower common bit line and that is connected to the upper latch block via an upper common bit line. The memory array includes a plurality of non-volatile memory cells, a lower even bit line and a lower odd bit line that are selectively connectable to the lower common bit line, an upper even bit line and an upper odd bit line that are selectively connectable to the upper common bit line, a first switch that electrically connects the lower even bit line to the upper even bit line in response to a first connection control signal and a second switch that electrically connects the lower odd bit line to the upper odd bit line in response to a second connection control signal.

17 Claims, 19 Drawing Sheets

U.S. PATENT DOCUMENTS

| | | | |
|---|---|---|---|
| 2005/0174841 A1* | 8/2005 | Ho | 365/185.03 |
| 2005/0213378 A1* | 9/2005 | Chang | 365/185.03 |
| 2006/0104117 A1* | 5/2006 | Kameda | 365/185.18 |
| 2007/0115724 A1* | 5/2007 | Hwang | 365/185.17 |
| 2008/0158954 A1 | 7/2008 | Hamilton et al. | |

FOREIGN PATENT DOCUMENTS

| | | |
|---|---|---|
| KR | 1020030072434 A | 9/2003 |
| KR | 1020040085616 A | 10/2004 |
| KR | 1020040100671 A | 12/2004 |
| KR | 1020050064666 A | 6/2005 |
| KR | 1020050094569 A | 9/2005 |
| KR | 1020060096749 A | 9/2006 |

* cited by examiner

THREE-LEVEL NON-VOLATILE SEMICONDUCTOR MEMORY DEVICES WITH LOWER AND UPPER BIT LINES SHARING A VOLTAGE CONTROL BLOCK

CLAIM OF PRIORITY

This application claims priority under 35 U.S.C. § 119 from Korean Patent Application No. 10-2006-9931, filed on Feb. 2, 2006, the disclosure of which is hereby incorporated by reference herein as if set forth in its entirety.

FIELD OF THE INVENTION

The present invention relates generally to semiconductor memory devices and, more particularly, to non-volatile semiconductor memory devices having three-level memory cells.

BACKGROUND

Non-volatile semiconductor memory devices are memory devices that can preserve stored data even when power is not supplied to the device. Various types of memory cells that are appropriate for non-volatile semiconductor memory devices are known. One such type of memory cell is the single transistor type memory cell.

A conventional single transistor type memory cell MC is illustrated in FIG. 1. As shown in FIG. 1, the memory cell MC includes a current path formed between a source S and a drain D on a semiconductor substrate, a floating gate FG formed between a dielectric oxide DOX and a gate oxide GOX, and a control gate CG. The floating gate FG traps electrons, and the trapped electrons establish the threshold voltage of the memory cell MC. To perform a read operation on the memory cell MC, the threshold voltage of the memory cell MC is detected and the value of the data is determined based on the detected threshold voltage level.

Most non-volatile semiconductor memory devices include memory cells MC that can be programmed and erased repeatedly. A single transistor memory cell MC is programmed by trapping electrons in the floating gate FG. The electrons may be trapped in the floating gate FG by, for example, Fowler-Nordheim tunneling (FN) or electron injection. Electron injection may be performed, for example, by Channel Hot-Electron injection (CHE) or Channel-Initiated Secondary Electron Injection (CISEI). Fowler-Nordheim tunneling is widely used in flash memory devices in which data is erased simultaneously.

Typically, a single transistor memory cell MC stores one of two data values. As shown in FIG. 2, the two data values are determined by a threshold voltage that is set to one of two levels. For example, data may be read as "1" when the detected threshold voltage of the memory cell MC is lower than a reference voltage VM, and data may be read as "0" when the detected threshold voltage of the memory cell MC is higher than the reference voltage VM.

A four-level memory cell has been developed that can provide for increased integration of semiconductor memory devices. The four-level memory cell, as illustrated in FIG. 3, can be programmed with one of four threshold voltage levels. As a result, the four-level memory cell can store any one of four data values. Therefore, a non-volatile semiconductor memory device having four-level memory cells (hereinafter referred to as a "four-level non-volatile semiconductor memory device") has a data storage capacity that is twice that of a non-volatile semiconductor memory device having two-level memory cells (hereinafter referred to as a "two-level non-volatile semiconductor memory device").

In a four-level memory cell, the margin of the threshold voltage between neighboring levels typically is very narrow (e.g., about 0.67 V). Moreover, the threshold voltage of each memory cell may be shifted due to the leakage of electrons or the like. Accordingly, the threshold voltage of the memory cell MC may be shifted from a threshold voltage programmed with one of the four levels to a neighboring level threshold voltage, which can result in errors in reading the data stored in the four-level memory cell.

SUMMARY

Pursuant to embodiments of the present invention, non-volatile semiconductor memory devices are provided that include a page buffer comprising a lower latch block and an upper latch block and a memory array that is connected to the lower latch block via a lower common bit line and connected to the upper latch block via an upper common bit line. In these devices, the memory array may comprise a plurality of non-volatile memory cells, a lower even bit line and a lower odd bit line that are selectively connectable to the lower common bit line, an upper even bit line and an upper odd bit line that are selectively connectable to the upper common bit line, a first switch that electrically connects the lower even bit line to the upper even bit line in response to a first connection control signal and a second switch that electrically connects the lower odd bit line to the upper odd bit line in response to a second connection control signal.

The memory array may also include a voltage control block. In some embodiments, the voltage control block is connected to the lower even bit line and the lower odd bit line so as to precharge and discharge the lower even bit line and the lower odd bit line, and is connected to the upper even bit line and the upper odd bit line through the lower even bit line and the lower odd bit line, respectively. In other embodiments, the voltage control block is connected to the upper even bit line and the upper odd bit line so as to precharge and discharge the upper even and odd bit lines, and is connected to the lower even bit line and the lower odd bit line through the upper even bit line and the upper odd bit line, respectively.

In further embodiments, the voltage control block comprises an even voltage control unit that is configured to precharge and discharge the even bit lines and an odd voltage control unit that is configured to precharge and discharge the odd bit lines. In some embodiments, the even voltage control unit is connected to the lower even bit line and is connected to the upper even bit line through the lower even bit line, while the odd voltage control unit is connected to the upper odd bit line and is connected to the lower odd bit line through the upper odd bit line. In other embodiments, the even voltage control unit is connected to the upper even bit line and is connected to the lower even bit line through the upper even bit line, while the odd voltage control unit is connected to the lower odd bit line and is connected to the upper odd bit line through the lower odd bit line.

In still other embodiments, the voltage control block comprises a high voltage control unit that is configured to precharge the bit lines and a low voltage control unit that is configured to discharge the bit lines.

The page buffer may be configured to map a set of first to third bits of data to threshold voltage levels of a pair of the first and second memory cells, and the first and second memory cells may be respectively disposed in a lower even string that is connected to the lower even bit line and an upper even string that is connected to the upper even bit line, or in a lower odd string that is connected to the lower odd bit line and an upper odd string that is connected to the upper odd bit line, the lower even string and the upper even string constituting a pair, and the lower odd string and the upper odd string constituting a pair. Moreover, the non-volatile semiconductor memory device may be a NAND type device.

Pursuant to further embodiments of the present invention, memory arrays of a non-volatile semiconductor memory device are provided that include a plurality of non-volatile memory cells. These memory arrays also include a lower even bit line and a lower odd bit line that are selectively connectable to a lower common bit line, and an upper even bit line and an upper odd bit line that are selectively connectable to an upper common bit line. The memory arrays further have a first low voltage control unit that is configured to discharge the upper even bit line and the lower even bit line in response to a first control signal. In these memory arrays, the first low voltage control unit is coupled to the upper even bit line and to the lower even bit line. Additionally, a first of the lower even bit line and the upper even bit line is connected directly to the first low voltage control unit, while a second of the lower even bit line and the upper even bit line is connected to the first low voltage control unit through the first of the lower even bit line and the upper even bit line.

The memory array may also include a second low voltage control unit that is configured to discharge the upper odd bit line and the lower odd bit line in response to a second control signal. A first of the lower odd bit line and the upper odd bit line may be connected directly to the second low voltage control unit and the other of the lower odd bit line and the upper odd bit line may be connected to the second low voltage control unit through the first of the lower odd bit line and the upper odd bit line. The memory array may further include a first high voltage control unit that is configured to precharge the upper odd bit line and the lower odd bit line in response to a third control signal. A first of the lower odd bit line and the upper odd bit line may be connected directly to the first high voltage control unit and a second of the lower odd bit line and the upper odd bit line may be connected to the first high voltage control unit through the first of the lower odd bit line and the upper odd bit line. The memory array may also include a second high voltage control unit that is configured to precharge the upper even bit line and the lower even bit line in response to a fourth control signal. A first of the lower even bit line and the upper even bit line may be connected directly to the second high voltage control unit and a second of the lower even bit line and the upper even bit line may be connected to the second high voltage control unit through the first of the lower even bit line and the upper even bit line.

Pursuant to still further embodiments of the present invention, methods of precharging selected bit lines of a non-volatile semiconductor memory device are provided. Pursuant to these methods, one of a lower odd bit line and an upper odd bit line is coupled to a first power supply voltage source through a first switch, while the other of the lower odd bit line and the upper odd bit line is simultaneously coupled to the first power supply voltage source through the first switch, the one of the lower odd bit line and the upper odd bit line, and a second switch.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
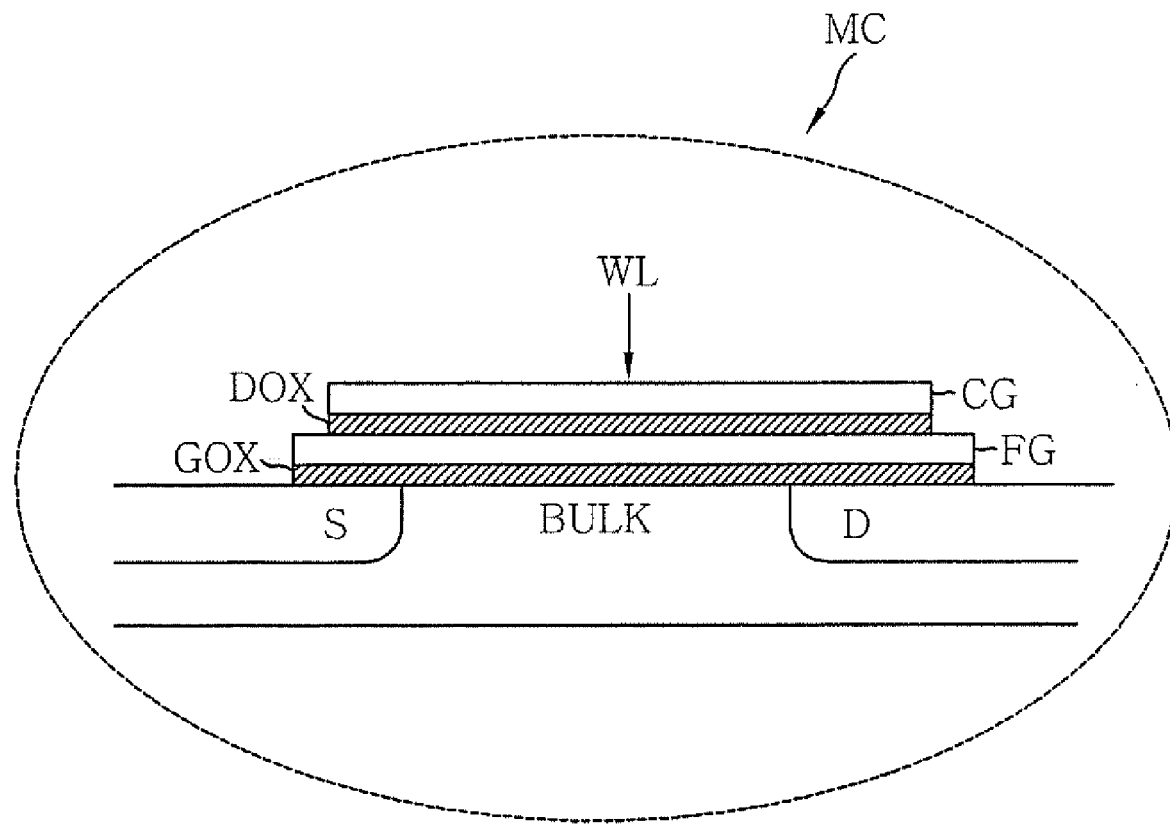
FIG. 1 is a cross-sectional diagram of a conventional single transistor type memory cell.
Figure 2:
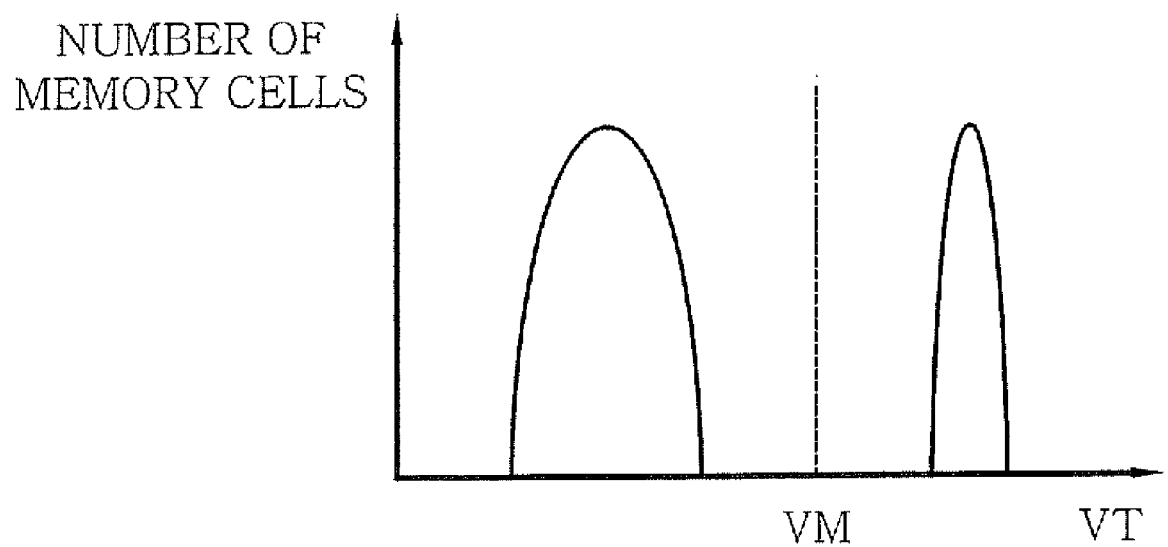
FIG. 2 is a graph illustrating the distribution of the threshold voltages of a conventional two-level memory cell.
Figure 3:
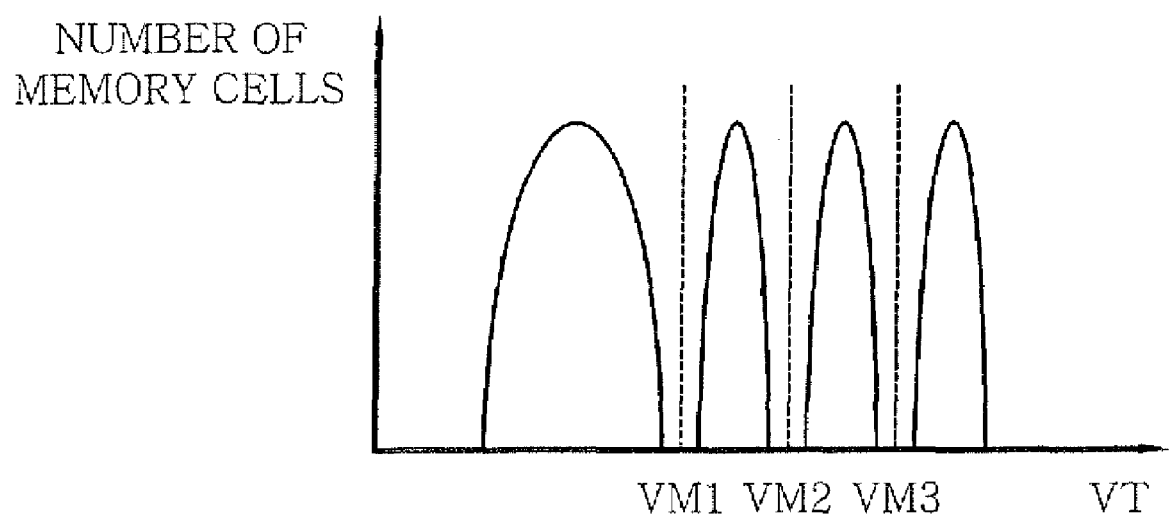
FIG. 3 is a graph illustrating the distribution of the threshold voltages of a conventional four-level memory cell.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 4:
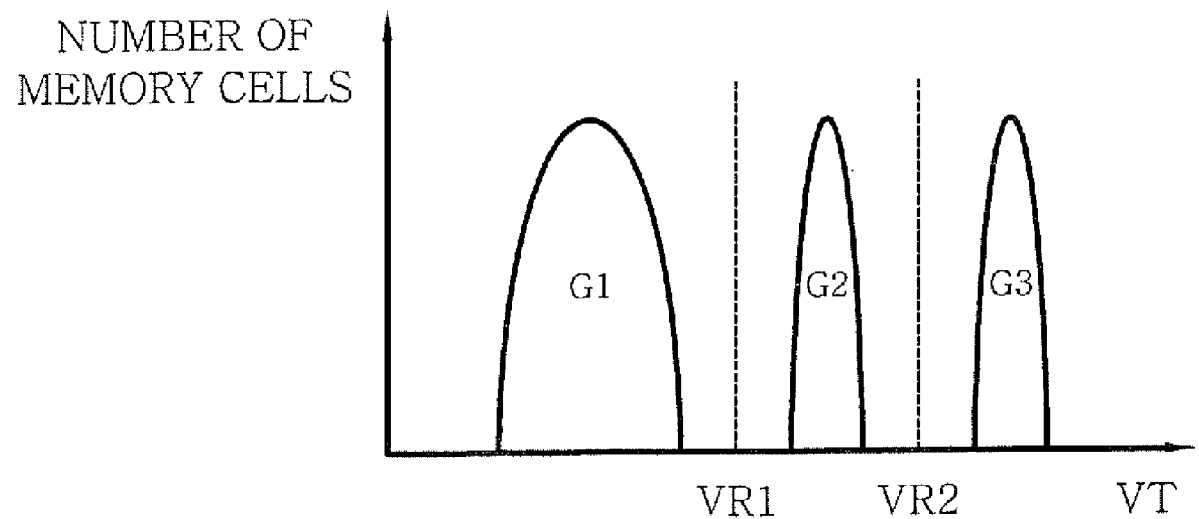
FIG. 4 is a graph illustrating the distribution of the threshold voltages of a three-level memory cell.

Non-volatile semiconductor memory devices according to embodiments of the present invention include three-level memory cells. As shown in FIG. 4, the three-level memory cell MC may be programmed with threshold voltage groups having three levels. The threshold voltage groups of the memory cells MC can be distinguished from each other using a first reference voltage VR1 and a second reference voltage VR2. Herein, a threshold voltage group that is lower than the first reference voltage VR1 is referred to as a "first threshold voltage group G1," while a threshold voltage group that is between the first reference voltage VR1 and the second reference voltage VR2 is referred to as a "second threshold voltage group G2." A threshold voltage group that is higher than the second reference voltage VR2 is referred to as a "third threshold voltage group G3."

The three-level memory cell has more data storage states that does a two-level memory cell, and thus provide a relatively high degree of integration. Furthermore, the interval between the threshold voltage levels in a three-level memory cell is larger than the interval between threshold voltage levels in a four-level memory cell. Accordingly, a non-volatile semiconductor memory device having three-level memory cells (referred to herein as a "three-level non-volatile semiconductor memory device") may provide both relatively high levels of integration with relatively good reliability.

Figure 5:
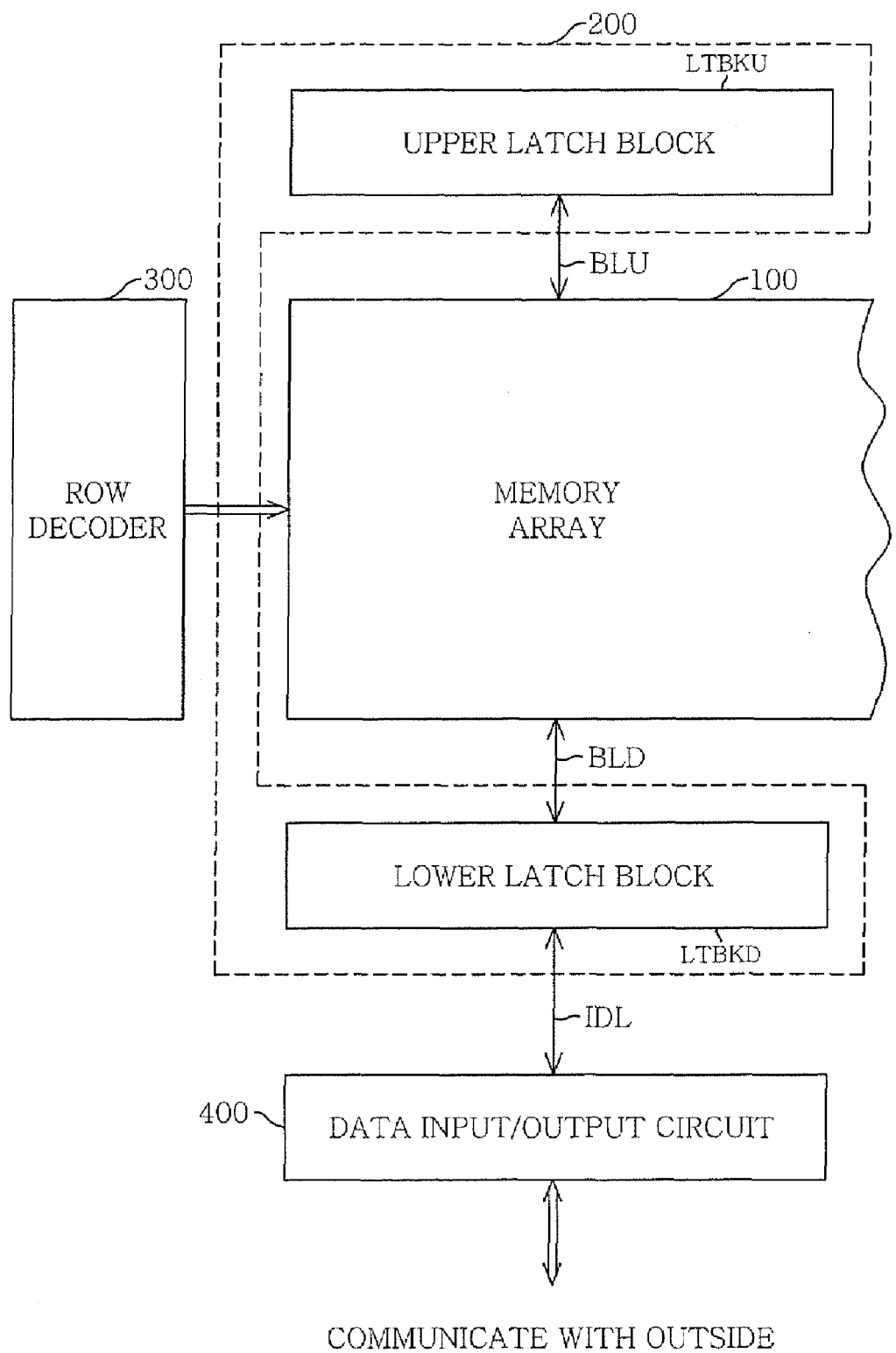
FIG. 5 is a block diagram illustrating part of a non-volatile semiconductor memory device according to embodiments of the present invention.

FIG. 5 is a block diagram illustrating part of a non-volatile semiconductor memory device according to some embodiments of the present invention. In FIG. 5, a memory array 100, a page buffer 200, a row decoder 300 and a data input/output circuit 400 of the semiconductor memory device are illustrated.

The memory array 100 includes a plurality of memory cells that may be arranged in a matrix composed of rows and columns. The memory array 100 includes a lower common bit line BLD and an upper common bit line BLU, which are selected by the same Y-address. Through the lower common bit line BLD, the lower latch block LTBKD of the page buffer 200 is connected to the memory array 100. Through the upper common bit line BLU, the upper latch block LTBKU of the page buffer 200 is connected to the memory array 100.

Figure 6:
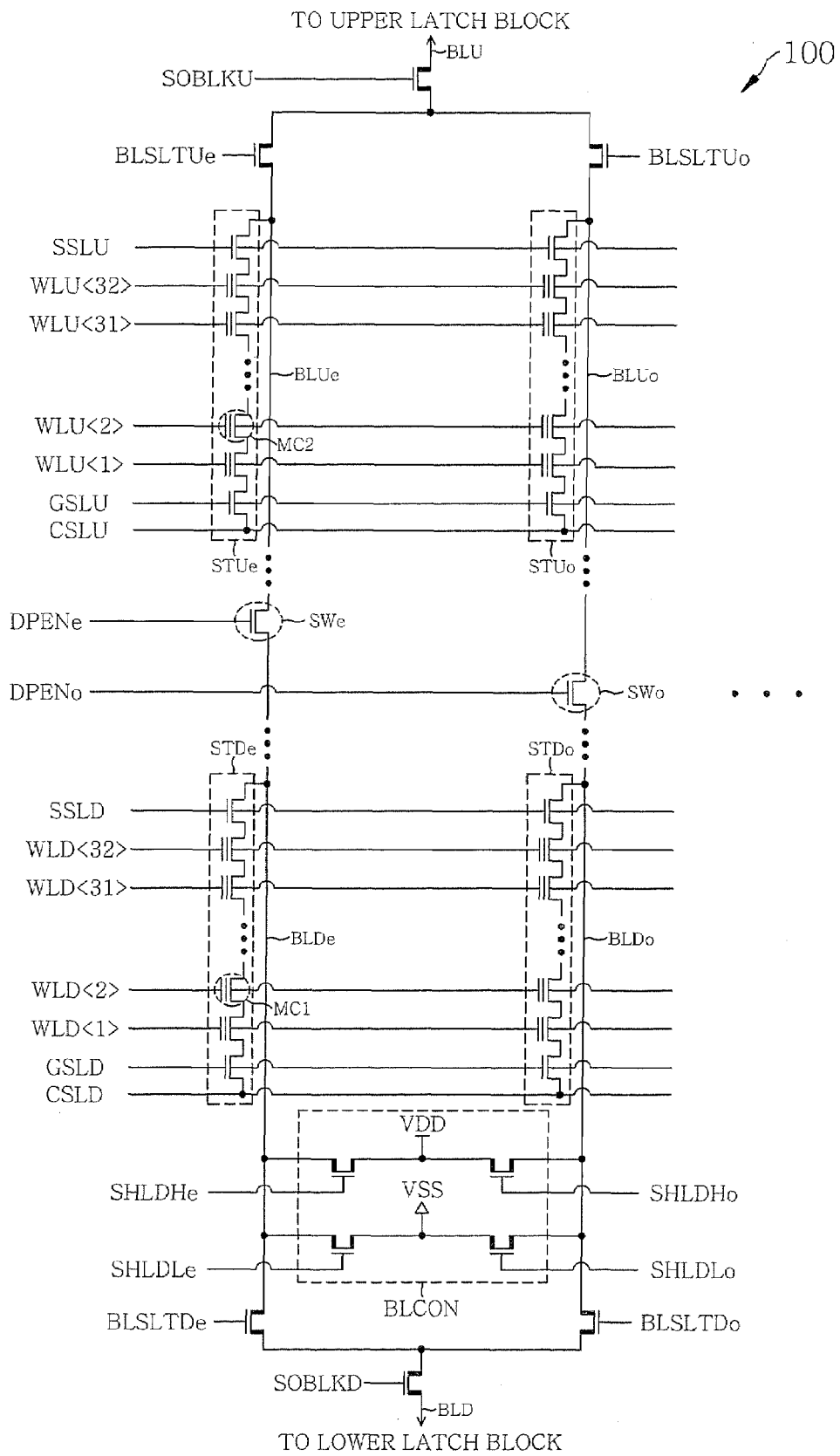
FIG. 6 is a circuit diagram illustrating part of the memory array of FIG. 5 in the case of a NAND-type non-volatile semiconductor memory device according to embodiments of the present invention.

FIG. 6 is a circuit diagram illustrating an implementation of part of the memory array 100 of FIG. 5 according to embodiments of the present invention. In FIG. 6, the non-volatile semiconductor memory device is a NAND-type device.

As shown in FIG. 6, the memory array 100 includes a lower even bit line BLDe and a lower odd bit line BLDo, an upper even bit line BLUe and an upper odd bit line BLUo, and an even switch SWe and an odd switch SWo. The lower even bit line BLDe is selectively connected to the lower common bit line BLD in response to a lower even bit line selection signal BLSLTDe and a lower sensing block selection signal SOBLKD. The lower odd bit line BLDo is selectively connected to the lower common bit line BLD in response to a lower odd bit line selection signal BLSLTDo and the lower sensing block selection signal SOBLKD.

Similarly, the upper even bit line BLUe is selectively connected to the upper common bit line BLU in response to an upper even bit line selection signal BLSLTUe and an upper sensing block selection signal SOBLKU. The upper odd bit line BLUo is selectively connected to the upper common bit line BLU in response to an upper odd bit line selection signal BLSLTUo and the upper sensing block selection signal SOBLKU.

The even switch SWe electrically connects the lower even bit line BLDe with the upper even bit line BLUe in response to an even connection control signal DPENe. In particular, when the even connection control signal DPENe is activated to logic level "H", the lower even bit line BLDe and the upper even bit line BLUe are electrically connected to each other. The odd switch SWo electrically connects the lower odd bit line BLDo with the upper odd bit line BLUo in response to an odd connection control signal DPENo. Specifically, when the odd connection control signal DPENo is activated to logic level "H", the lower odd bit line BLDo and the upper odd bit line BLUo are electrically connected to each other. Thus, a switch is provided for each bit line.

As is also shown in FIG. 6, the memory array 100 also includes a lower even string STDe, a lower odd string STDo, an upper even string STUe and an upper odd string STUo. The lower even string STDe and the lower odd string STDo are connected, respectively, to the lower even bit line BLDe and the lower odd bit line BLDo in response to a lower string selection signal SSLD. The upper even string STUe and the upper odd string STUo are connected, respectively, to the upper even bit line BLUe and the upper odd bit line BLUo in response to an upper string selection signal SSLU.

The memory array 100 further includes a voltage control block BLCON. The voltage control block BLCON precharges the bit lines BLD, BLDe, BLDo, BLU, BLUe, and BLUo to a first voltage (in this particular embodiment a power voltage VDD), and discharges them to a second voltage (in this particular embodiment a ground voltage VSS).

The voltage control block BLCON may operate as follows. When an even high voltage shielding signal SHLDHe is activated to logic level "H", the lower even bit line BLDe is precharged to the power voltage VDD. If the even connection control signal DPENe is also activated to logic level "H", the upper even bit line BLUe is also precharged to the power voltage VDD via the lower even bit line BLDe. Similarly, when an even low voltage shielding signal SHLDLe is activated to logic level "H", the lower even bit line BLDe is discharged to the ground voltage VSS. If the even connection control signal DPENe is also activated to logic level "H", the upper even bit line BLUe is also discharged to the ground voltage VSS via the lower even bit line BLDe.

In the same manner, an odd high voltage shielding signal SHLDHo and an odd low voltage shielding signal SHLDLo may be used, respectively, to precharge the lower odd bit line BLDo to the power voltage VDD, or discharge the lower odd bitline BLDo to the ground voltage VSS. If the odd connection control signal DPENo is also activated to logic level "H", the tipper odd bit line BLUo is also precharged to the power voltage VDD, or is discharged to the ground voltage VSS, via the lower odd bit line BLDo.

A plurality of memory cells are included in the lower even string STDe, the lower odd string STDo, the upper even string STUe and the upper odd string STUo. In this specification, a memory cell included in the lower even string STDe or the lower odd string STDo may be referred to as a "first memory cell MC1", while a memory cell included in the upper even string STUe or upper odd string STUo may be referred to as a "second memory cell MC2." This is for convenience of description only, and does not limit the claims of the present invention. Memory cells MC1 are depicted in FIG. 6 attached to lower wordlines WLD<1> . . . WLD<32>, and memory cells MC2 are also depicted in FIG. 6 attached to upper wordlines WLU<1> . . . WLU<32>. The first memory cells MC1 and the second memory cells MC2 may have the same structure, and are non-volatile memory cells that can be electrically programmed and erased and can preserve data without the supply of power thereto.

In certain embodiments of the present invention, first and second memory cells MC1 and MC2 that together constitute a pair of memory cells are provided, respectively, in the lower even string STDe and the upper even string STUe, or are provided, respectively, in the lower odd string STDo and the upper odd string STUo.

When a read or program operation is performed on a memory cell pair that comprises a first memory cell MC1 in the lower even string STDe and a second memory cell MC2 in the upper even string STUe, the lower odd bit line BLDo and the upper odd bit line BLUo function as shielding lines. In this case, the odd connection control signal DPENo is activated to logic level "H", and the lower odd bit line BLDo and the upper odd bit line BLUo are controlled together by the voltage control block BLCON.

When a read or program operation is performed on a memory cell pair that comprises a first memory cell MC1 in the lower odd string STDo and a second memory cell MC2 in the upper odd string STUo, the lower even bit line BLDe and the upper even bit line BLUe function as shielding lines. In this case, the even connection control signal DPENe is activated to logic level "H", and the lower even bit line BLDe and the upper even bit line BLUe are controlled together by the voltage control block BLCON.

Thus, when the upper even bit line BLUe and the upper odd bit line BLUo are (1) precharged to the power voltage VCC, (2) discharged to the ground voltage VSS, or (3) function as shielding lines, they are controlled by the voltage control block BLCON via the lower even bit line BLDe and the lower odd bit line BLDo.

In the embodiment of FIG. 6, either the even bit lines BLDe and BLUe or the odd bit lines BLDo and BLUo function as shielding lines. As such, noise and coupling between bit lines may be reduced and/or prevented, which may result in improved operational characteristics.

A set of first to third bits of data can be programmed in a pair of first and second memory cells MC1 and MC2. The storage states of the pair of memory cells MC1 and MC2 as determined by the threshold voltages thereof are read as the first to third bits of data. In the present specification and drawings, first to third bits may be represented by reference characters "BIT1~BIT3."

Referring to FIG. 5 again, the page buffer 200 includes a lower latch block LTBKD and an upper latch block LTBKU. The lower latch block LTBKD is electrically connected to the lower common bit line BLD, and provides data to an internal data line IDL. The upper latch block LTBKU is electrically connected to the upper common bit line BLU.

The page buffer 200 is coupled to the memory array 100 via the lower and upper common bit lines BLD and BLU. The page buffer 200 operates such that a set of first to third bits BIT1 to BIT3 of data are mapped to threshold voltage groups of the pair of first and second memory cells MC1 and MC2.

Figure 7:
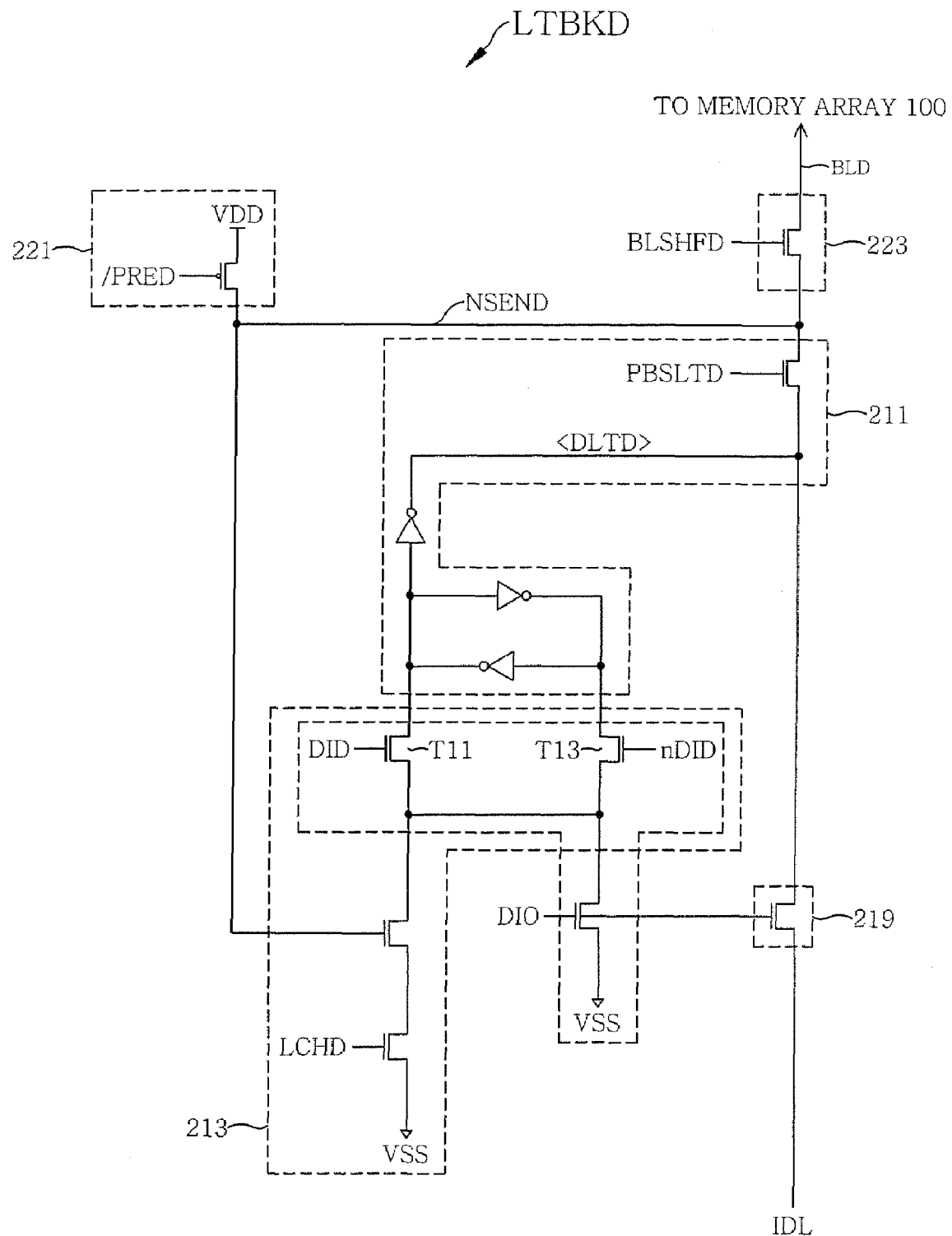
FIG. 7 is a circuit diagram illustrating a lower latch block according to embodiments of the present invention that can be used as the lower latch block of FIG. 5.

FIG. 7 is a circuit diagram illustrating an implementation of the lower latch block LTBKD of FIG. 5 according to certain embodiments of the present invention. The lower latch block LTBKD can store lower latch data DLTD, and is connected to the lower common bit line BLD. The lower latch block LTBKD includes a lower sensing terminal NSEND, a lower latch unit 211, a lower flip unit 213 and a lower latch control unit 215.

As shown in FIG. 7, the lower sensing terminal NSEND is connected to the lower common bit line BLD in response to a lower common bit line connection signal BLSHFD. In this specific embodiment, the data of the lower sensing terminal NSEND is provided to the lower common bit line BLD via the lower common bit line connection unit 223, which may be implemented, for example, as a transistor.

The lower latch unit 211 latches and stores lower latch data DLTD. The lower latch unit 211 can also transmit the lower latch data DLTD to the lower common bit line BLD in response to a lower buffer selection signal PBSLTD.

The lower flip unit 213 flips the lower latch data DLTD from logic level "L" to logic level "H" depending on the voltage level of the lower sensing terminal NSEND. In this case, a lower input signal DID is activated to logic level "H." Furthermore, the lower flip unit 213 inversely flips the lower latch data DLTD from logic level "H" to logic level "L" depending on the voltage level of the lower sensing terminal NSEND. In this case, a lower inverted input signal NDID is activated to logic level "H."

The lower latch control unit 215 sets the lower latch data DLTD to logic level "H" when the lower input signal DID is activated to logic level "H." The lower latch control unit 215 resets the lower latch data DLTD to logic level "L" when the lower inverted input signal NDID is activated to logic level "H."

In the embodiment of FIG. 7, an NMOS transistor T11 that has a gate that receives the lower input signal DID, and an NMOS transistor T13 that has a gate that receives the lower inverted input signal nDID, are included in both the lower flip unit 213 and the lower latch control unit 215.

The lower latch block LTBKD may also include an output unit 219, a lower precharge unit 221, and/or a lower common bit line connection unit 223.

The output unit 219 may provide the lower latch data DLTD of the lower latch unit 211 to the internal data line IDL in response to an output control signal DIO.

The lower precharge unit 221 precharges the lower sensing terminal NSEND to the power voltage VDD in response to a lower sensing precharge signal /PRED.

The lower common bit line connection unit 223 controls the electrical connection between the lower common bit line BLD and the lower sensing terminal NSEND in response to the lower common bit line connection signal BLSHFD and the lower common bit line selection signal SOBLKD (see FIG. 6).

Figure 8:
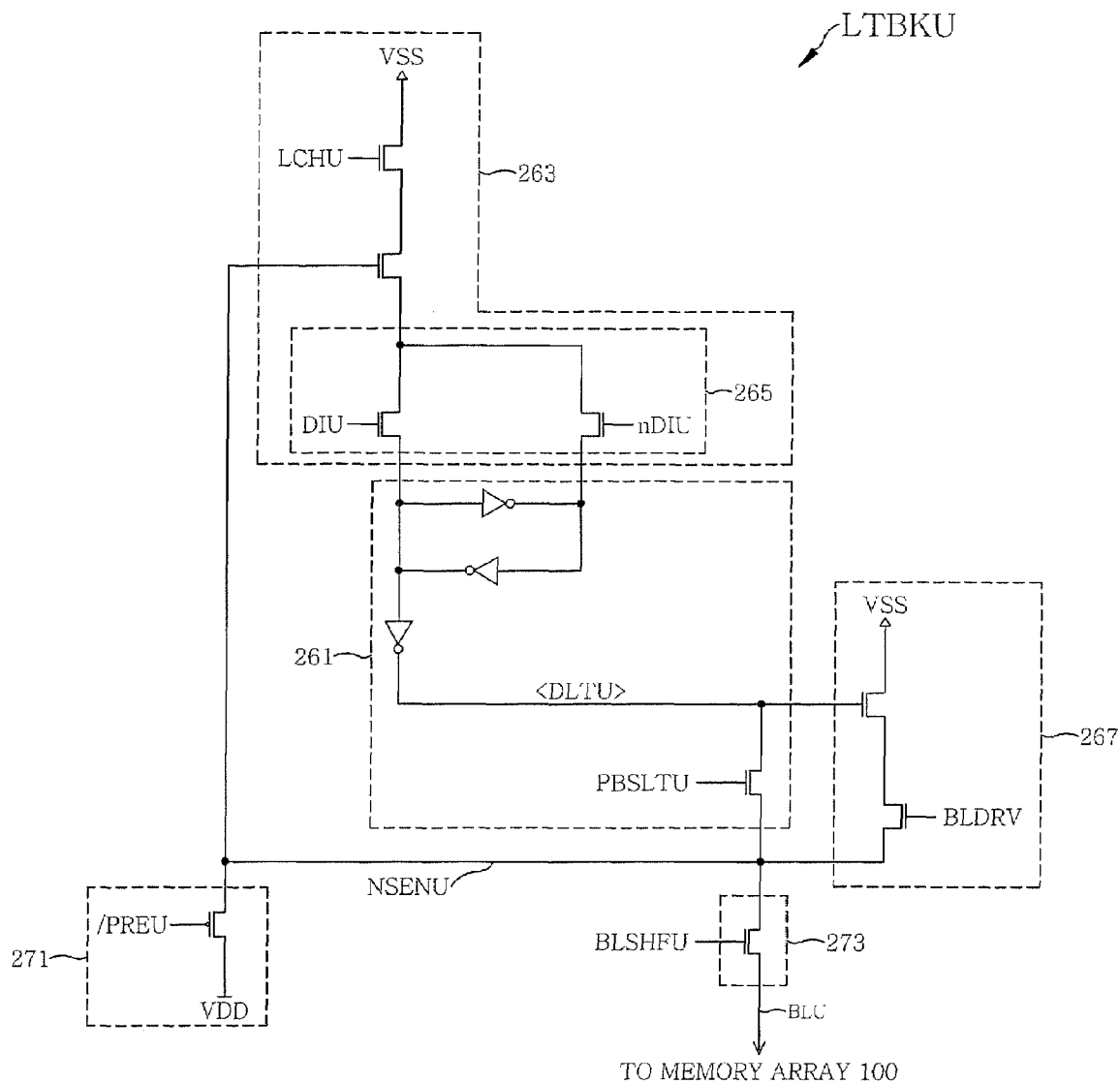
FIG. 8 is a circuit diagram illustrating ant upper latch block according to embodiments of the present invention that can be used as the upper latch block of FIG. 5.

FIG. 8 is a circuit diagram illustrating the upper latch block LTBKU of FIG. 5. The upper latch block LTBKU may store upper latch data DLTU, and is connected to the upper common bit line BLU. The upper latch block LTBKU includes an upper sensing terminal NSENU, an upper latch unit 261, an upper flip unit 263 and a dumping unit 267.

The upper sensing terminal NSENU is connected to the upper common bit line BLU in response to the upper common bit line connection signal BLSHFU. In the embodiment of FIG. 8, the data of the upper sensing terminal NSENU is provided to the upper common bit line BLU via the upper common bit line connection unit 273.

The upper latch unit 261 latches and stores the upper latch data DLTU. The upper latch unit 261 can transmit the upper latch data DLTU to the upper common bit line BLU in response to the upper buffer selection signal PBSLTU.

The upper flip unit 263 flips the upper latch data DLTU from logic level "L" to logic level "H" depending on the voltage level of the upper sensing terminal NSENU. In this case, the upper input signal DIU is activated to logic level "H." Furthermore, the upper flip unit 263 inversely flips the upper latch data DLTU from logic level "H" to logic level "L" depending on the voltage level of the upper sensing terminal NSENU. In this case, the upper inverted input signal nDIU is activated to logic level "H."

The upper latch control unit 265 sets the upper latch data DLTU to logic level "H" when the upper input signal DIU is activated to logic level "H." Furthermore, the upper latch control unit 265 resets the upper latch data DLTU to logic level "L" when the upper inverted input signal nDIU is activated to logic level "H."

The dumping unit 267 discharges the upper sensing terminal NSENU to the ground voltage VSS in response to the upper latch data DLTU. Specifically, when the upper latch data DLTU is at logic level "H", the dumping unit 267 discharges the upper sensing terminal NSENU to the ground voltage VSS in response to a bit line driving signal BLDRV. Accordingly, the dumping unit 267 functions to invert the upper latch data DLTU having logic level "H", and provides the inverted data to the upper sensing terminal NSENU.

In some embodiments, the upper latch block LTBKU may further include an upper precharge unit 271 and an upper common bit line connection unit 273. The upper precharge unit 271 precharges the upper sensing terminal NSENU to the power voltage VDD in response to an upper sensing precharge signal /PREU. The upper common bit line connection unit 273 controls the electrical connection between the upper common bit line BLU and the upper sensing terminal NSENU in response to an upper common bit line connection signal BLSHFU and an upper common bit line selection signal SOBLKU (see FIG. 6).

Referring to FIG. 5 again, the row decoder 300, which is coupled to the memory array 100, controls the voltage level of a selected word line WL, and generates lower and upper string selection signals SSLD and SSLU and lower and upper ground selection signals GSLD and GSLU.

The data input and output circuit 400 outputs data latched by the page buffer 200 to an external system, and loads data input from an external system to the page buffer 200.

Next, methods of programming the non-volatile semiconductor memory devices according to embodiments of the present invention will be described. In these particular methods, the programming of the pair of memory cells is performed in the order of first to third page program steps respectively using the first to third bits BIT1 to BIT3, as illustrated in FIG. 9.

Figure 9:
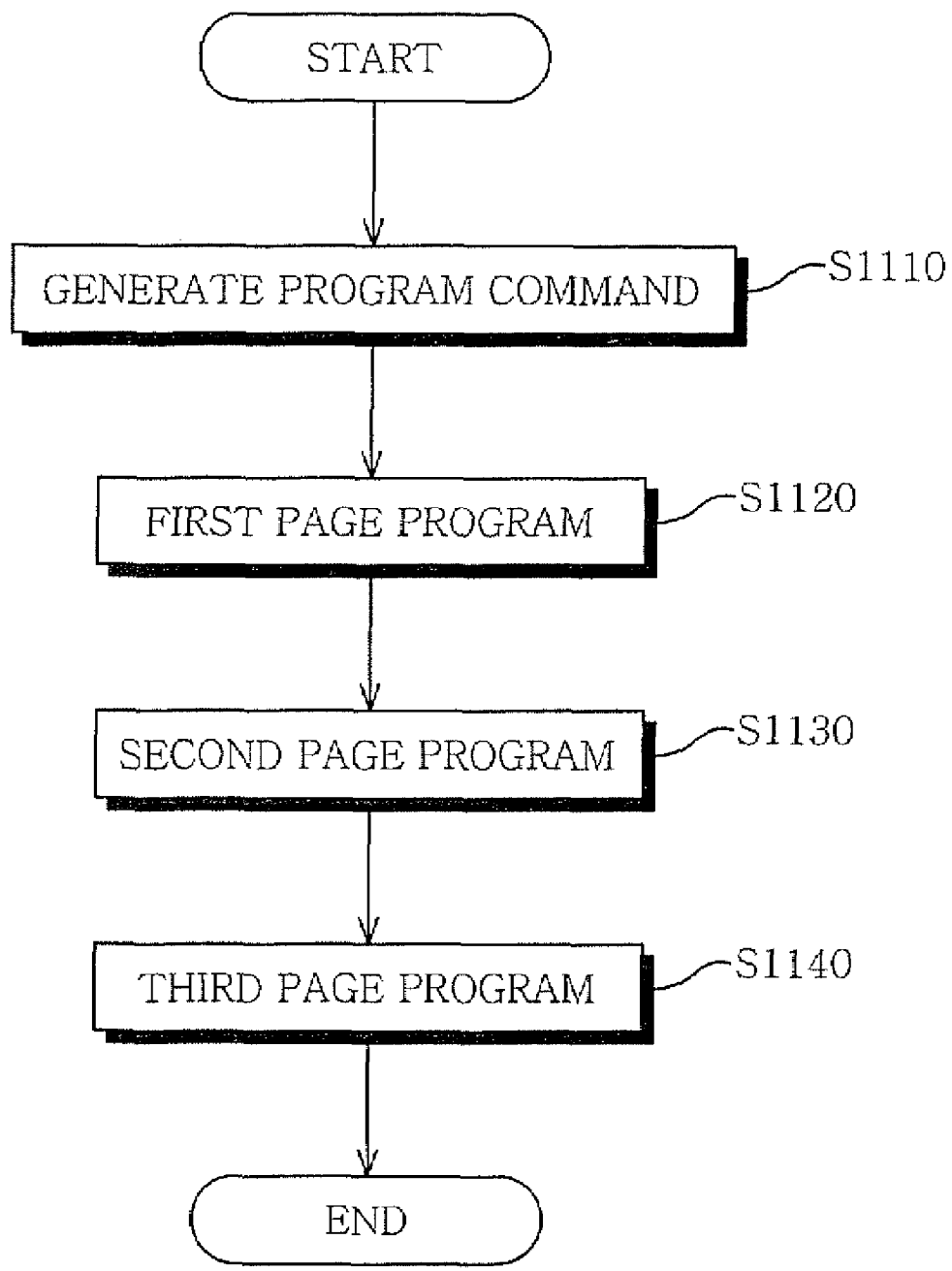
FIG. 9 is a flowchart illustrating methods of driving non-volatile semiconductor memory devices according to embodiments of the present invention.

FIG. 9 is a flowchart illustrating methods of driving the non-volatile semiconductor memory device according to embodiments of the present invention. In particular, FIG. 9 illustrates methods of programming the non-volatile semiconductor memory device. As shown in FIG. 9, first, an operation command CMD for directing a program operation is input at step S1110. At step S1120, the first page program operation is performed. As shown in STEP1 of FIG. 10, the threshold voltage of the first memory cell MC1 is programmed with the second threshold voltage group G2 if the first bit BIT1 has a value "0" at step S1120. Otherwise, the threshold voltage of the first memory cell MC1 remains programmed with the first threshold voltage group G1 if the first bit BIT1 has a value "1."

At step S1130, the second page program operation is performed. As shown in STEP2 of FIG. 10, the threshold voltage of the second memory cell MC2 is programmed with the second threshold voltage group G2 if the second bit BIT2 has a value "0."

At step S1140, the third page program operation is performed. As shown in STEP3 of FIG. 10, the threshold voltage of the first memory cell MC1 and/or the second memory cell MC2 may be programmed with the third threshold voltage group G3 depending upon the data of the third bit BIT3.

In detail, at step S1140, the data of the third bit BIT3 is loaded onto the lower latch block LTBKD and the upper latch block LTBKU as the lower latch data DLTD and the upper latch data DLTU. The lower latch data DLTD and the upper latch data DLTU are flipped based on the threshold voltages of the first and second memory cells MC1 and MC2 that have been programmed according to the first and second bits BIT1 and BIT2.

Figure 11:
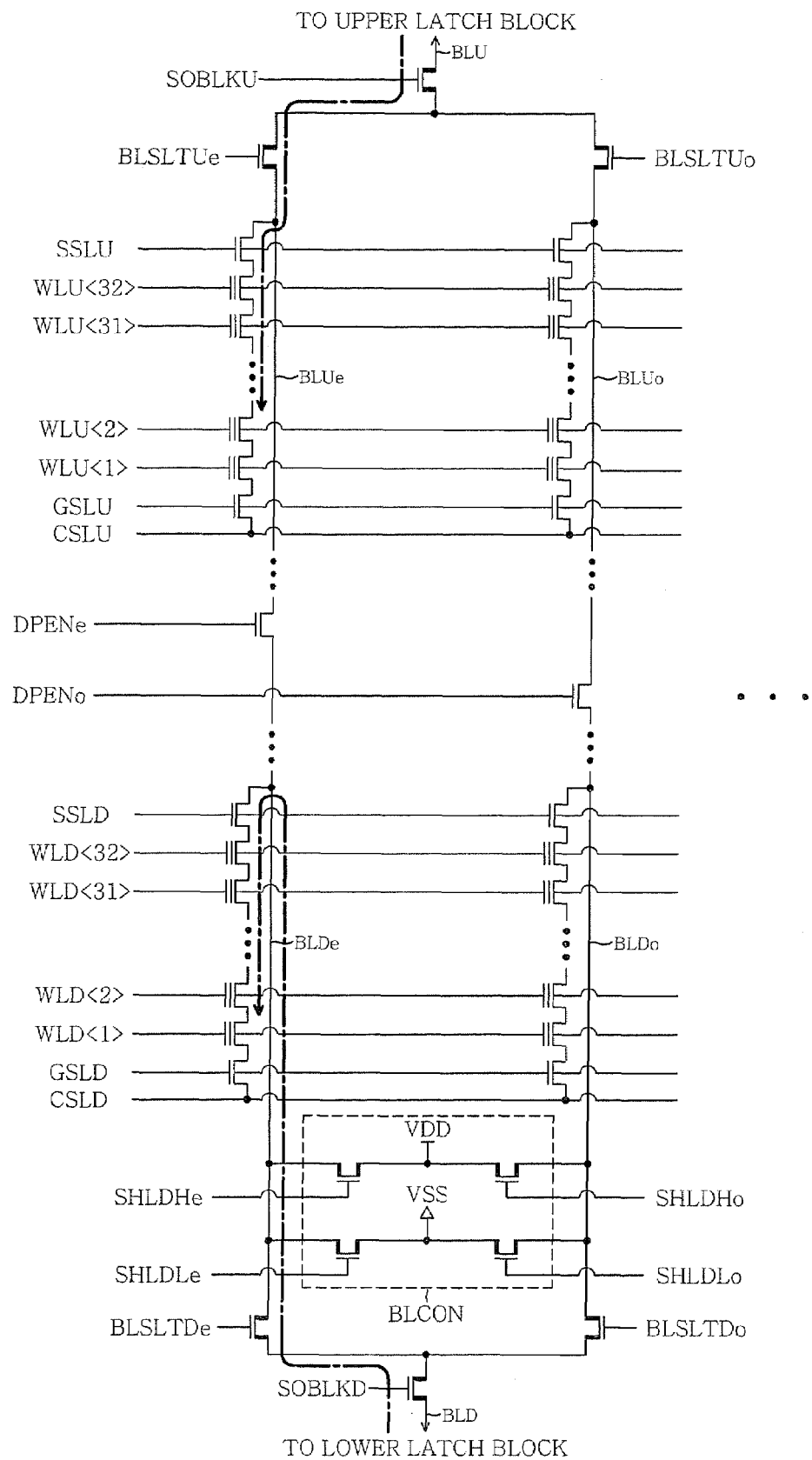
FIG. 11 is a circuit diagram illustrating the case where data are respectively provided from lower and upper bit lines to the first and second memory cells simultaneously in the driving method of FIG. 10.

Thereafter, the flipped lower latch data DLTD and the flipped upper latch data DLTU are provided to the lower even bit line BLDe and the upper even bit line BLUe, respectively. At this time, the lower latch data DLTD and the upper latch data DLTU, as illustrated in FIG. 11, are respectively provided to the lower even bit line BLDe and the upper even bit line BLUe at the same time, and respectively program the first and second memory cells MC1 and MC2. In this case, the even connection control signal is activated to logic level "L", and the lower even bit line BLDe and the upper even bit line BLUe are electrically separated from each other.

Referring to FIG. 10 again, the threshold voltages of the first and second memory cells MC1 and MC2 corresponding to the data values of the first to third bits BIT1 to BIT3 are as follows.

In the case CASE1 in which the data values of first, second and third bits BIT1, BIT2 and BIT3 are all "1", the threshold voltages of the first and second memory cells MC1 and MC2 are both in an erase state, that is, the first threshold voltage group G1.

In the case CASE2 in which the data values of the first and second bits BIT1 and BIT2 are "1" and the data of a third bit BIT3 is "0", the threshold voltages of the first and second memory cells MC1 and MC2 are both in the third threshold voltage group G3.

In the case CASE3 in which the data of the first bit BIT1 is "1", the data of the second bit BIT2 is "0", and the data of the third bit BIT3 is "1", the threshold voltage of the first memory cell MC1 is located in the first threshold voltage group G1, and the threshold voltage of the second memory cell MC2 is located in the second threshold voltage group G2.

In the case CASE4 in which the data of the first bit BIT1 is "1", the data of the second bit BIT2 is "0", and the data of the third bit BIT3 is "0", the threshold voltage of the first memory cell MC1 is located in the first threshold voltage group G1, and the threshold voltage of the second memory cell MC2 is located in the third threshold voltage group G3.

In the case CASE5 in which the data of the first bit BIT1 is "0", the data of the second bit BIT2 is "1" and the data of the third bit BIT3 is "1", the threshold voltage of the first memory cell MC1 is located in the second threshold voltage group G2 and the threshold voltage of the second memory cell MC2 is located in the first threshold voltage group G1.

In the case CASE6 in which the data of the first bit BIT1 is "0", the data of the second bit BIT2 is "1" and the data of the third bit BIT3 is "0", the threshold voltage of the first memory cell MC1 is located in the third threshold voltage group G3 and the threshold voltage of the second memory cell MC2 is located in the first threshold voltage group G1.

In the case CASE7 in which the data of the first bit BIT1 is "0", the data of the second bit BIT2 is "0" and the data of the third bit BIT3 is "1", the threshold voltages of the first and second memory cells MC1 and MC2 are both located in the second threshold voltage group G2.

In the case CASE8 in which the data values of the first, second and third bits BIT1, BIT2 and BIT3 are all "0", the threshold voltage of the first memory cell MC1 is located in the third threshold voltage group G3 and the threshold voltage of the second memory cell MC2 is located in the second threshold voltage group G2.

Next, methods of reading data from non-volatile semiconductor memory devices according to embodiments of the present invention are described. In this case, although the first to third page reading steps, in which the first to third bits BIT1 to BIT3 are read, are randomly performed, the pair of memory cells can be read.

Figure 12:
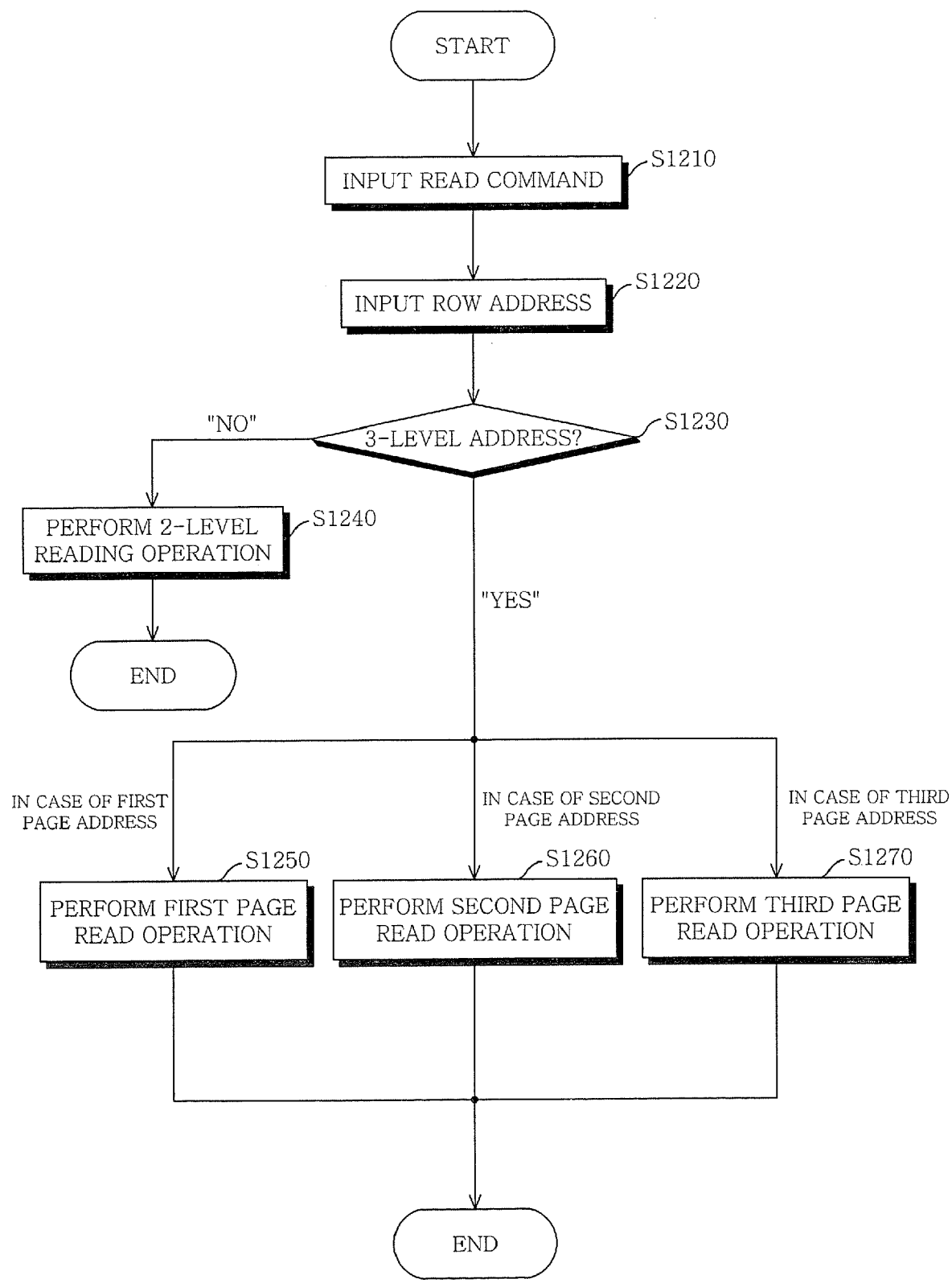
FIG. 12 is a flowchart illustrating methods of driving non-volatile semiconductor memory devices according to further embodiments of the present invention.

FIG. 12 is a flowchart illustrating methods for driving the non-volatile semiconductor memory device according to embodiments of the present invention. In particular, FIG. 12 illustrates methods of reading data from the non-volatile semiconductor memory device.

Referring to FIG. 12, an operation command CMD used to direct a read operation is input at step S1210. A row address is input at step S1220. At step S1230, a determination is made as to whether the input row address is a three-level address selecting the pair of first and second memory cells MC1 and MC2. If it is determined that the input row address is not a three-level address, a conventional read operation for a two-level memory cell is performed at step S1240. If instead it is determined that the input row address is a three-level address, a read operation based on a corresponding page is performed at step S1250, S1260 or S1270.

Figure 10:
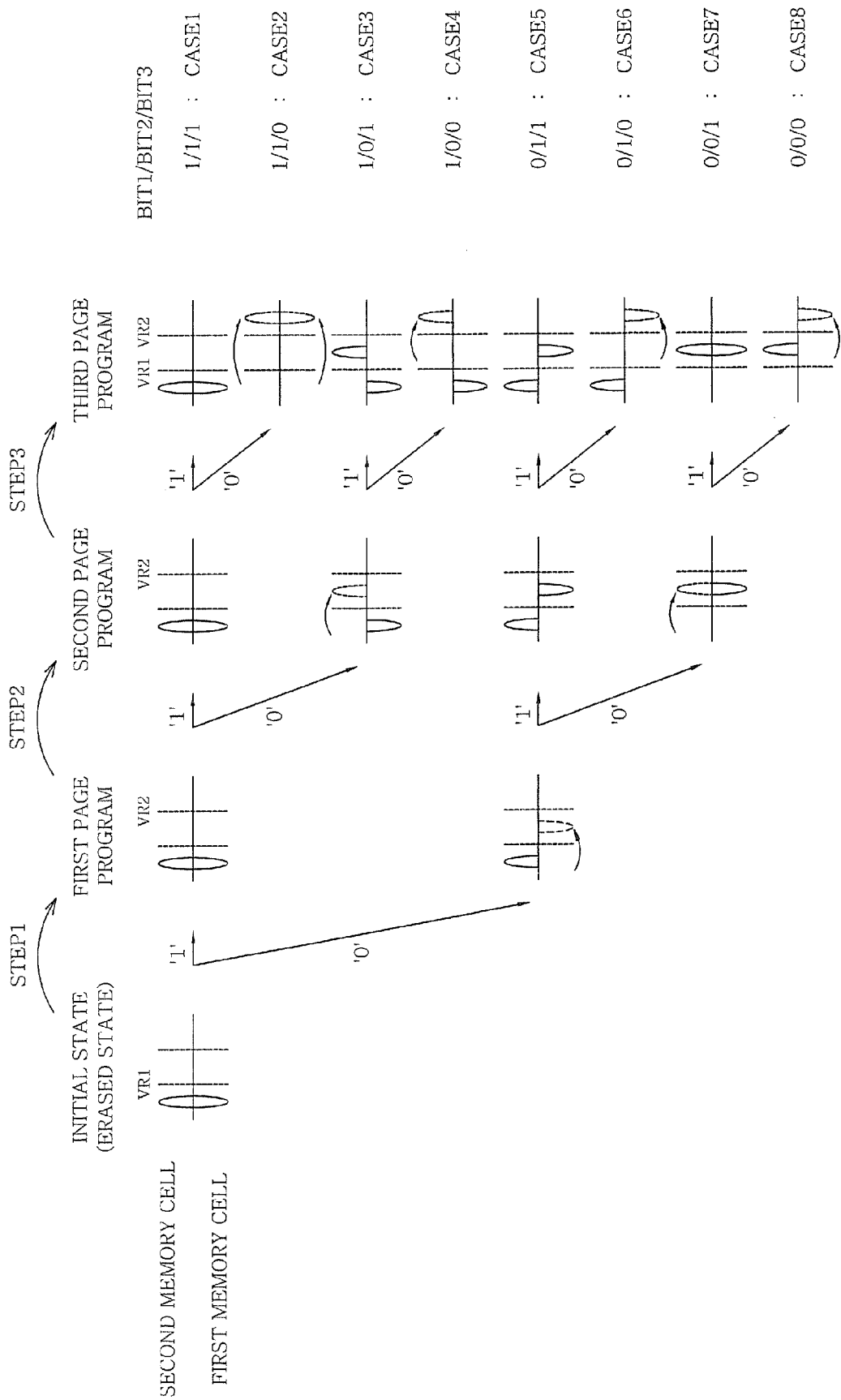
FIG. 10 is a diagram illustrating variations in the threshold voltages of first and second memory cells based on the non-volatile semiconductor memory device driving method of FIG. 9.

The first page read operation of step S1250 is performed in such a way as to identify one of CASE1 to CASE4 of FIG. 10.

Figure 13:
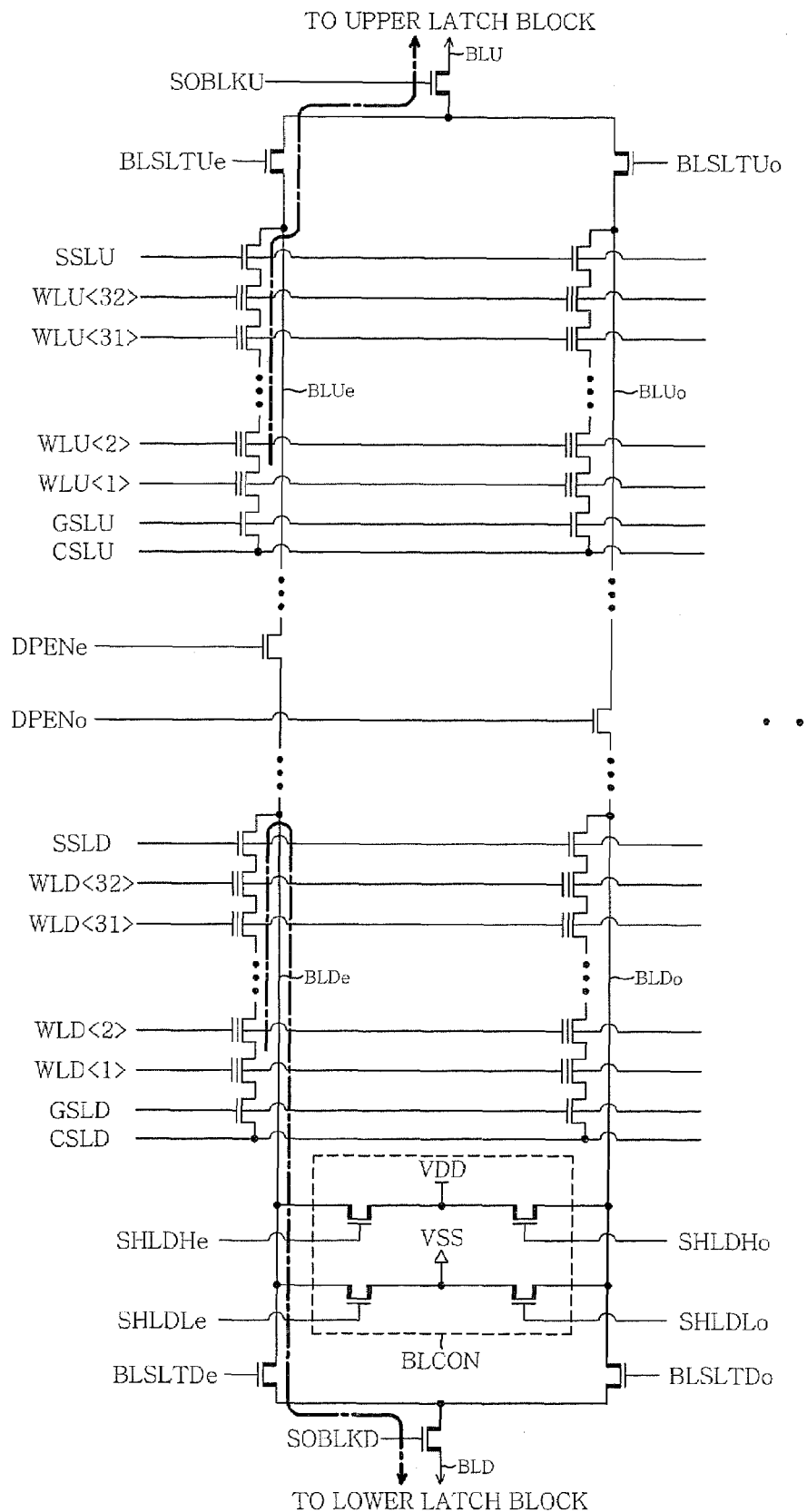
FIG. 13 is a circuit diagram illustrating the case where data are respectively provided from the first and second memory cells to the lower and upper bit lines at the same time in the driving method of FIG. 10.

That is, when the case CASE1, CASE3 or CASE4 where the threshold voltage of the first memory cell MC1 is lower than the first reference voltage VR1 is identified, or the case CASE2 where each of the threshold voltages of the first and second memory cells MC1 and MC2 is higher than the second reference voltage VR2 is identified, the data value of the first bit BIT1 is read as "1". If CASE2 is identified, the threshold voltages of the first and second memory cells MC1 and MC2 are respectively provided to the lower even bit line BLDe and the upper even bit line BLUe at the same time, as illustrated in FIG. 13. In this case, the even connection control signal DPENe is deactivated to logic level "L", and the lower even bit line BLDe and the upper even bit line BLUe are electrically separated from each other.

The second page read operation of step S1260 is performed in such a way as to identify one of CASE1, CASE2, CASE5 and CASE6 of FIG. 10. That is, when the case CASE1, CASE5 or CASE6 where the threshold voltage of the second memory cell MC1 is lower than the first reference voltage VR1 is identified or the case CASE2 where each of the threshold voltages of the first and second memory cells MC1 and MC2 is higher than the second reference voltage VR2 is identified, the data value of the second bit BIT2 is read as "1." If CASE2 is identified, the even connection control signal DPENe is deactivated to logic level "L", and the lower even bit line BLDe and the upper even bit line BLUe are electrically separated from each other. This is similar to the first page read operation of step S1250.

The third page read operation of step S1270 is performed in such a way as to identify one of CASE2, CASE4, CASE6 and CASES of FIG. 10. That is, when the case CASE2, CASE6 or CASE8 where the threshold voltage of the first memory cell MC1 is higher than the second reference voltage VR2 is identified, or the case CASE2 where the threshold voltage of the second memory cell MC2 is higher than the second reference voltage VR2 is identified, the data value of the third bit BIT3 is read as "0." In this case, the threshold voltages of the first and second memory cells MC1 and MC2 are respectively provided to the lower even bit line BLDe and the upper even bit line BLUe at the same time. In this case, the even connection control signal DPENe is deactivated to logic level "L", and the lower even bit line BLDe and the upper even bit line BLUe are electrically separated from each other.

Even in the case where, in the read and program operations of the non-volatile semiconductor memory device of the present invention, the lower even bit line BLDe and the upper even bit line BLUe are electrically separated from each other, the lower odd bit line BLDo and the upper odd bit line BLUo are electrically connected to each other.

The above-described operation can be achieved because, in the non-volatile semiconductor memory devices according to embodiments of the present invention, the switches SWe and SWo, which control electric connections between the even bit lines BLDe and BLUe and the odd bit lines BLDo and BLUo, are controlled using independent control signals DPENe and DPENo. That is, in the non-volatile semiconductor memory devices according to embodiments of the present invention, the upper bit lines BLUe and BLUo and the lower bit lines BLDe and BLDo share the voltage control block. This provides a considerable advantage in terms of layout, as will be discussed herein with respect to the comparative example of FIG. 19.

Figure 14:
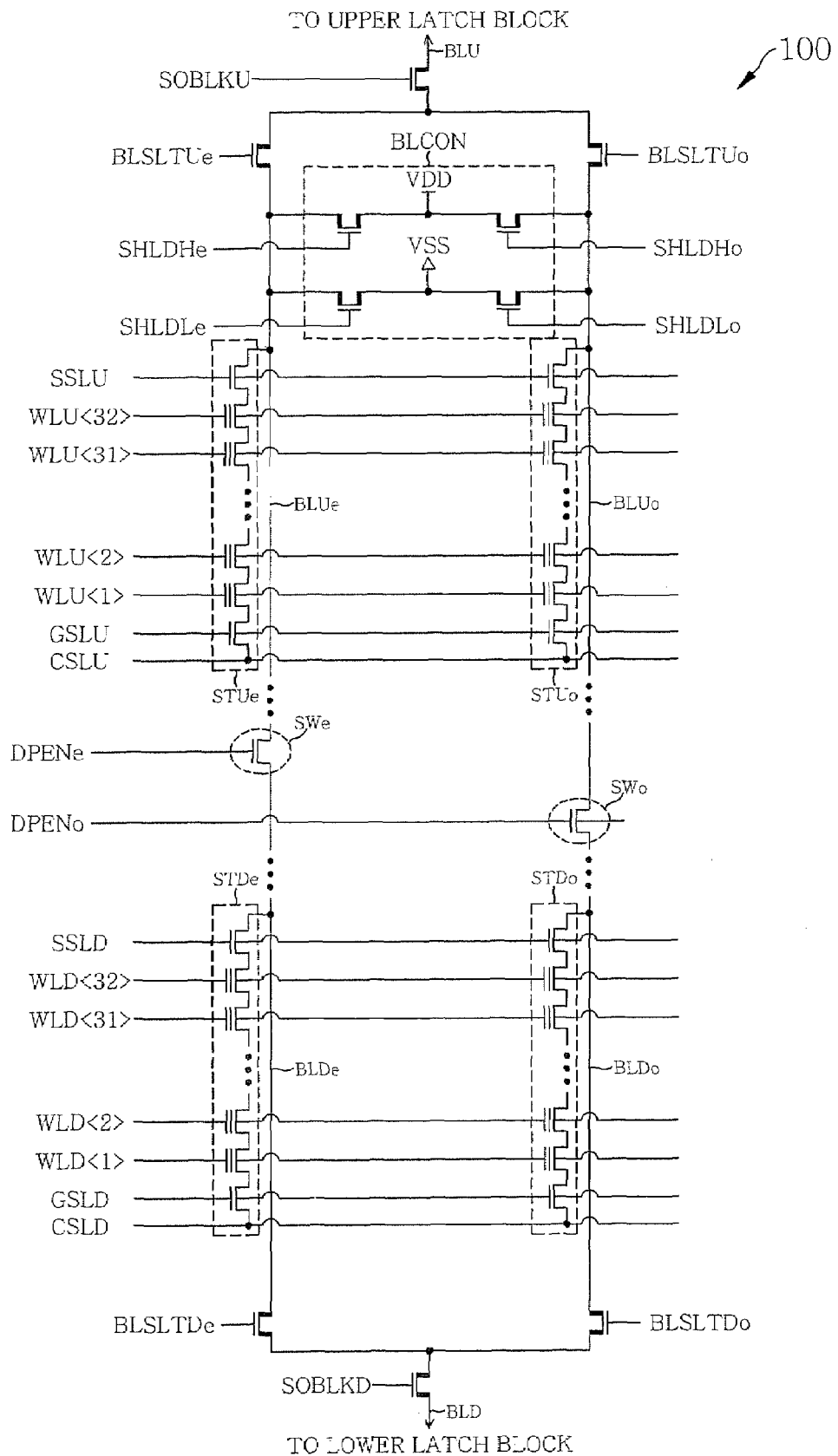
FIG. 14 is a circuit diagram illustrating another example of part of the memory array of FIG. 5 according to further embodiments of the present invention.

FIG. 14 is a diagram illustrating another implementation of part of the memory array 100 of FIG. 5 according to embodiments of the present invention. The memory array 100 of FIG. 14 is identical to the memory array 100 of FIG. 6, except that in the array 100 of FIG. 6, the voltage control block BLCON is connected to the lower even bit line BLDe and the lower odd bit line BLDo, whereas in the array of FIG. 14, the voltage control block BLCON is connected to the upper even bit line BLUe and the upper odd bit line BLUo. Accordingly, when the lower even bit line BLDe and the lower odd bit line BLDo are precharged to the power voltage VCC, are discharged to the ground voltage VSS, or function as shielding lines, they are controlled by the voltage control block BLCON via the upper even bit line BLUe and the upper odd bit line BLUo. Since the remainder of the construction and operation of the example of FIG. 14 is the same as in the example of FIG. 6, detailed descriptions thereof are omitted in the present specification.

Figure 15:
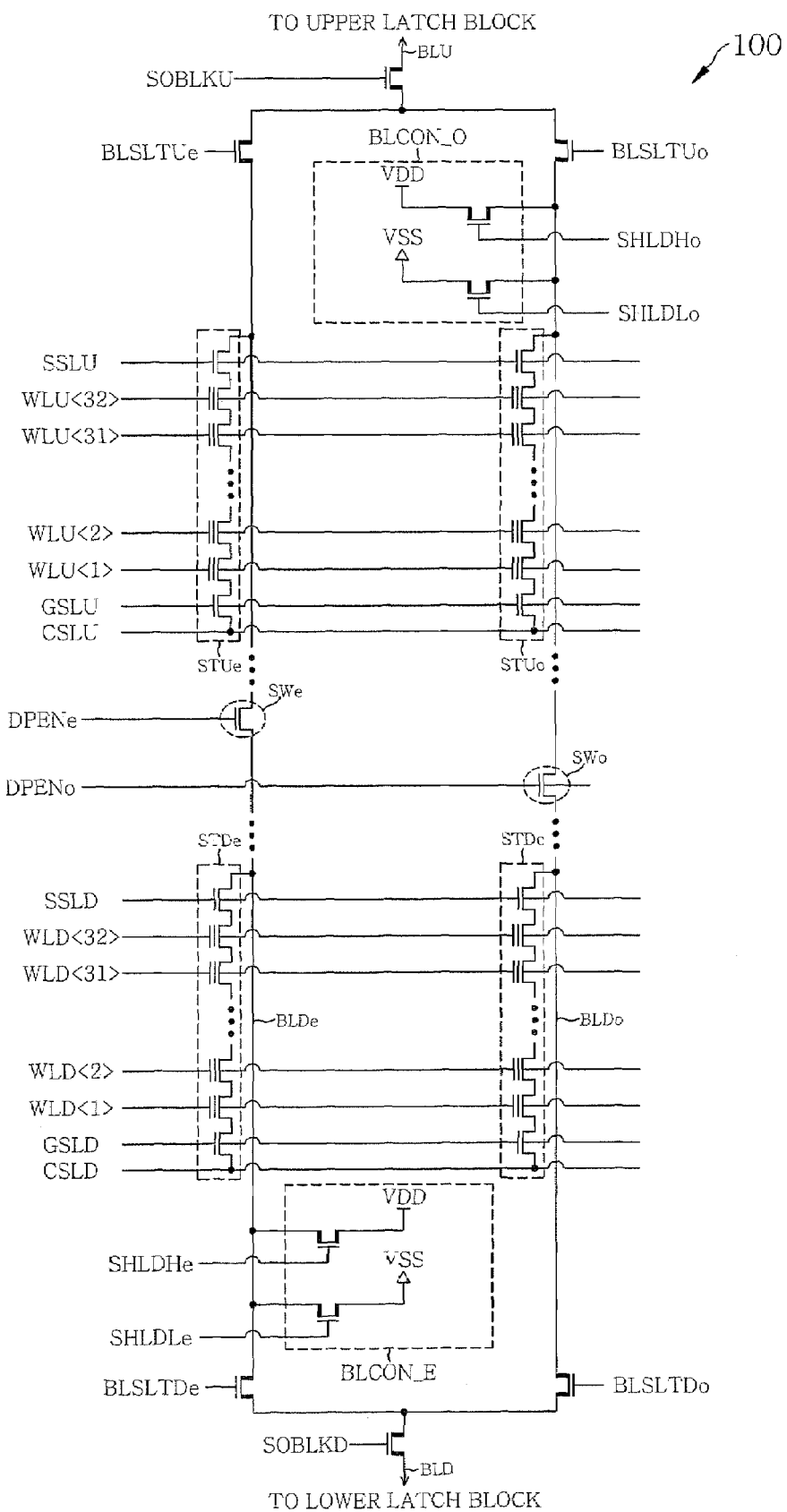
FIGS. 15 to 18 are circuit diagrams illustrating other examples of part of the memory array of FIG. 5 according to further embodiments of the present invention.

FIG. 15 is a diagram illustrating another implementation of part of the memory array 100 of FIG. 5 according to embodiments of the present invention. The construction of the memory array 100 of FIG. 15 is identical to the construction of the memory array 100 of FIG. 6, except that in the array of FIG. 15, the voltage control block BLCON is divided into an even voltage control unit BLCON_E and an odd voltage control unit BLCON_O, where the even voltage control unit BLCON_E is connected to the lower even bit line BLDe, and the odd voltage control unit BLCON_O is connected to the upper odd bit line BLUo. Thus, in the device of FIG. 15, when the upper even bit line BLUe is precharged to the power voltage VCC, is discharged to the ground voltage VSS, or functions as a shielding line, it is controlled by the even voltage control unit BLCON_E via the lower even bit line BLDe. In a similar manner, when the lower odd bit line BLDo is precharged to the power voltage VCC, is discharged to the ground voltage VSS, or functions as a shielding line, it is controlled by the odd voltage control unit BLCON_O via the upper odd bit line BLUo. Since the remainder of the construction and operation of the example of FIG. 15 is the same as in the example of FIG. 6, detailed descriptions thereof are omitted in the present specification.

Figure 16:
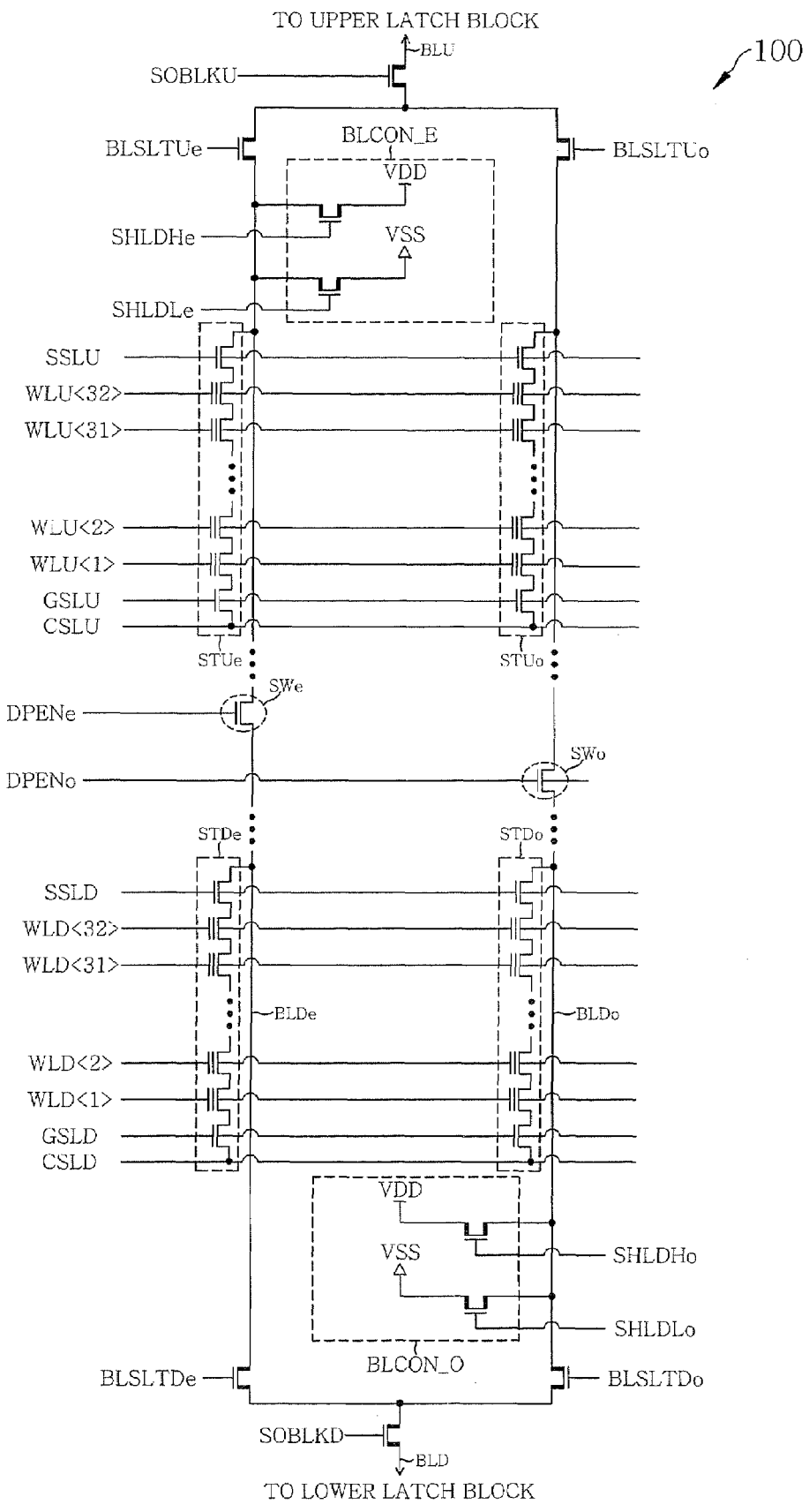

FIG. 16 is a diagram illustrating another implementation of part of the memory array 100 of FIG. 5 according to embodiments of the present invention. The memory array 100 of FIG. 16 is identical to the memory array 100 of FIG. 15, except that in the memory array of FIG. 16, the even voltage control unit BLCON_E is connected to an upper even bit line BLUe and the odd voltage control unit BLCON_O is connected to a lower odd bit line BLDo. When the lower even bit line BLDe is precharged to the power voltage VCC, is discharged to the ground voltage VSS, or functions as a shielding line, it is controlled by the even voltage control unit BLCON_E via the upper even bit line BLUe. In a similar manner, when the upper odd bit line BLUo is precharged to the power voltage VCC, is discharged to the ground voltage VSS, or functions as a shielding line, it is controlled by the odd voltage control unit BLCON_O via the lower odd bit line BLDo. Since the remainder of the construction and operation of the example of FIG. 16 is the same as in the example of FIG. 15, detailed descriptions thereof are omitted in the present specification.

Figure 17:
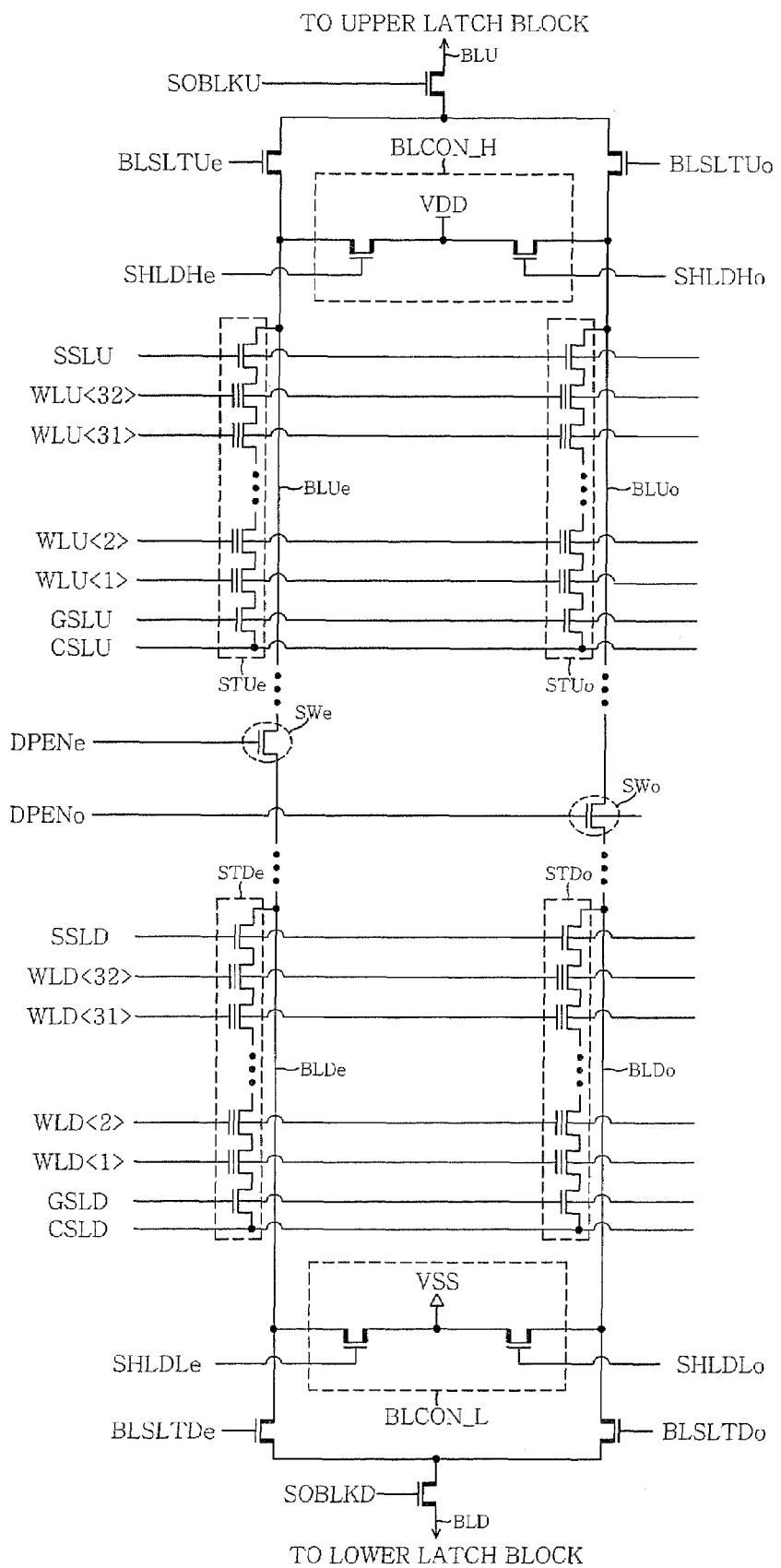

FIG. 17 is a diagram illustrating another implementation of part of the memory array 100 of FIG. 5 according to embodiments of the present invention. The memory array 100 of FIG. 17 is identical to the memory array 100 of FIG. 6, except that the voltage control block BLCON is divided into a high voltage control unit BLCON_H and a low voltage control unit BLCON_L. The high voltage control unit BLCON_H is connected to the upper even bit line BLUe and the upper odd bit line BLUo, and the low voltage control unit BLCON_L is connected to the lower even bit line BLDe and the lower odd bit line BLDo. When the lower even bit line BLDe and the lower odd bit line BLDo are precharged to the power voltage VDD or function as shielding lines, they are controlled by the high voltage control unit BLCON_H via the upper even bit line BLUe and the upper odd bit line BLUo. In a similar manner, when the upper even bit line BLUe and the upper odd bit line BLUo are discharged to the ground voltage VSS or function as shielding lines, they are controlled by the low voltage control unit BLCON_L via the lower even bit line BLDe and the lower odd bit line BLDo. Since the remainder of the construction and operation of the example of FIG. 17 is the same as in the example of FIG. 6, detailed descriptions thereof are omitted in the present specification.

Figure 18:
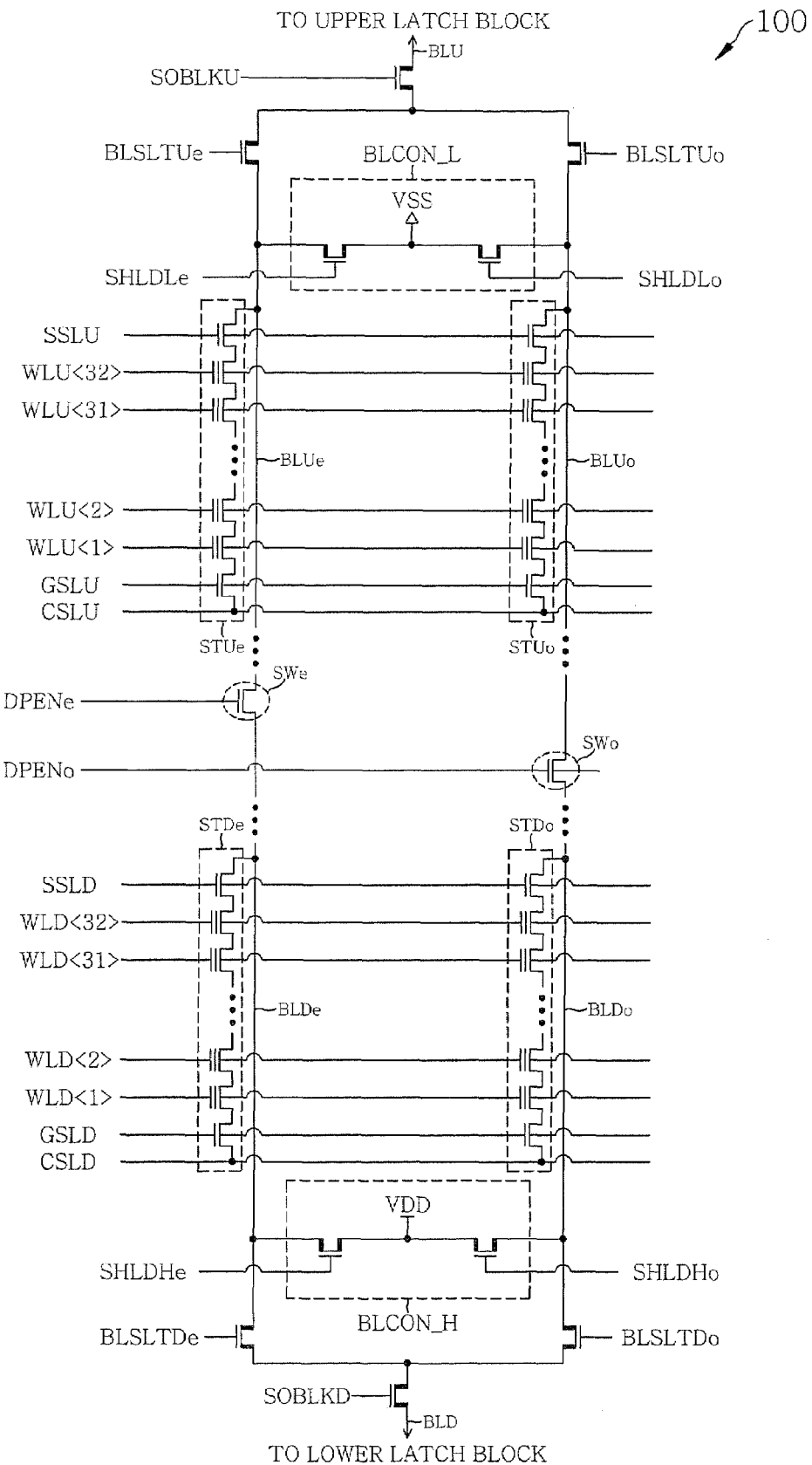

FIG. 18 is a diagram illustrating another implementation of part of the memory array 100 of FIG. 5 according to embodiments of the present invention. The memory array 100 of FIG. 18 is identical to the memory array 100 of FIG. 17, except that the high voltage control unit BLCON_H is connected to the lower even bit line BLUe and the lower odd bit line BLUo, and the low voltage control unit BLCON_L is connected to the upper even bit line BLDe and the upper odd bit line BLDo. When the upper even bit line BLUe and the upper odd bit line BLUo are precharged to the power voltage VDD or function as shielding lines, they are controlled by the high voltage control unit BLCON_H via the lower even bit line BLDe and the lower odd bit line BLDo. In a similar manner, when the lower even bit line BLDe and the lower odd bit line BLDo are discharged to the ground voltage VSS or function as shielding lines, they are controlled by the low voltage control unit BLCON_L via the upper even bit line BLUe and the upper odd bit line BLUo. Since the remainder of the construction and operation of the example of FIG. 18 are the same as in the example of FIG. 17, detailed descriptions thereof are omitted in the present specification.

Figure 19:
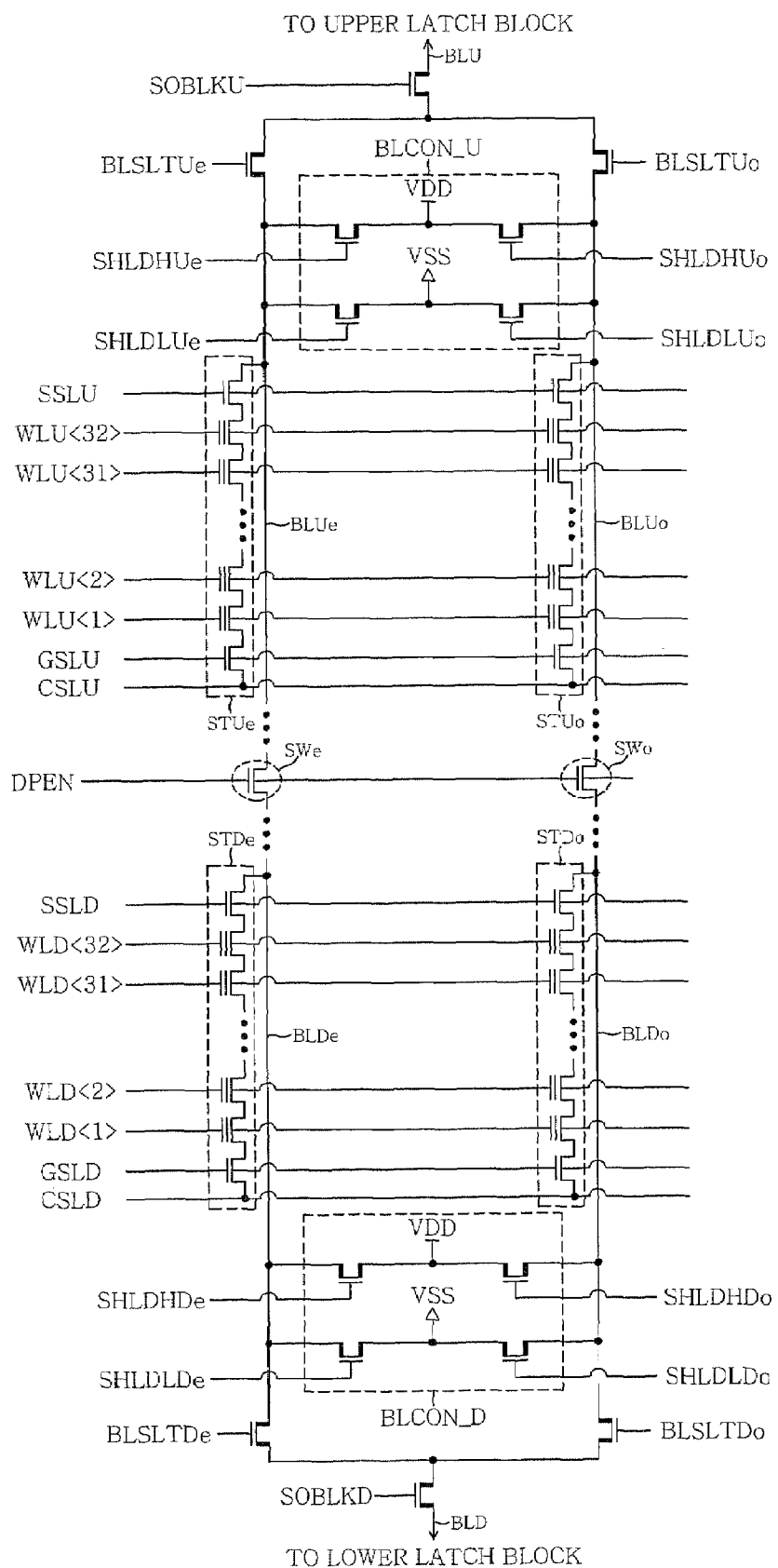
FIG. 19 is a circuit diagram illustrating a comparative example of part of the memory array of FIG. 5.

FIG. 19 is a circuit diagram illustrating a comparative example of part of the memory array 100 of FIG. 5, which illustrates the case of a NAND-type non-volatile semiconductor memory device. The comparative example of FIG. 19 is different from the example of FIG. 6 in that the voltage control block BLCON is divided into an upper voltage control unit BLCON_U and a lower voltage control unit BLCON_D. The upper voltage control unit BLCON_U is connected to the upper even bit line BLUe and the upper odd bit line BLUo, and the lower voltage control unit BLCON_D is connected to the lower even bit line BLDe and the lower odd bit line BLDo. The comparative example of FIG. 19 is also different from the example of FIG. 6 in that the even switch SWe and the odd switch SWo are controlled by a single connection control signal DPEN.

With the circuit of FIG. 19, when the lower even bit line BLDe and the lower odd bit line BLD are precharged to the power voltage VCC, are discharged to the ground voltage VSS, or function as shielding lines, they are controlled by the lower voltage control unit BLCON_D. When the upper even bit line BLUe and the upper odd bit line BLUo are precharged to the power voltage VCC, are precharged to the ground voltage VSS, or function as shielding lines, they are controlled by the upper voltage control unit BLCON_D. The number of transistors (implemented using high voltage transistors having thick insulation layers) constituting the voltage control block BLCON of the comparative example of FIG. 19 may be greater when compared to the embodiments of FIGS. 6 and 14 to 18 of the present invention.

The non-volatile semiconductor memory devices according to embodiments of the present invention may include memory cells that can be controlled to three threshold voltage levels and a page buffer that controls the memory cell. These non-volatile semiconductor memory devices may have a high degree of integration compared to conventional two-level non-volatile semiconductor memory devices. The non-volatile semiconductor memory devices according to embodiments of the present invention may also have high reliability as compared to four-level non-volatile semiconductor memory devices.

In the non-volatile semiconductor memory devices according to embodiments of the present invention, switches that control the electrical connections of the even bit lines and the odd bit lines are controlled by independent control signals. As a result, the upper bit lines and the lower bit lines share the voltage control block, so that the size of the layout of the non-volatile semiconductor memory device may be considerably reduced, compared to the comparative example.

Although some embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A non-volatile semiconductor memory device, comprising:
   a page buffer comprising a lower latch block and an upper latch block; and
   a memory array connected to the lower latch block via a lower common bit line and connected to the upper latch block via an upper common bit line, the memory array comprising
      a plurality of non-volatile memory cells,
      a lower even bit line and a lower odd bit line that are selectively connectable to the lower common bit line,
      an upper even bit line and an upper odd bit line that are selectively connectable to the upper common bit line,
      a first switch that is configured to electrically connect the lower even bit line to the upper even bit line in response to a first connection control signal, and
      a second switch that is configured to electrically connect the lower odd bit line to the upper odd bit line in response to a second connection control signal; and
   a voltage control block connected to one of the upper even bit line and the lower even bit line to precharge and discharge the upper and the lower even bit lines and connected to one of the upper odd bit line and the lower odd bit line to precharge and discharge the upper and the lower odd bit lines,
   wherein the lower and the upper even bit lines are electrically connected by the first switch when the voltage control block precharges and discharges the one of the upper and the lower even bit lines and the lower and the upper odd bit lines are electrically connected by the second switch when the voltage control block precharges and discharges the one of the upper and the lower odd bit lines.

2. The non-volatile semiconductor memory device as set forth in claim 1, wherein the memory array further comprises the voltage control block that is connected to the lower even bit line and the lower odd bit line so as to precharge and discharge the lower even and odd bit lines, and wherein the voltage control block is connected to the upper even bit line and the upper odd bit line through the lower even bit line and the lower odd bit line, respectively.

3. The non-volatile semiconductor memory device as set forth in claim 1, wherein the memory array further comprises the voltage control block that is connected to the upper even bit line and the upper odd bit line so as to precharge and discharge the upper even and odd bit lines, and wherein the voltage control block is connected to the lower even bit line and the lower odd bit line through the upper even bit line and the upper odd bit line, respectively.

4. The non-volatile semiconductor memory device as set forth in claim 1, wherein the memory array further comprises the voltage control block that includes an even voltage control unit that is configured to precharge and discharge the even bit lines and an odd voltage control unit that is configured to precharge and discharge the odd bit lines, wherein the even voltage control unit is connected to the lower even bit line and is connected to the upper even bit line through the lower even bit line, and wherein the odd voltage control unit is connected to the upper odd bit line and is connected to the lower odd bit line through the upper odd bit line.

5. The non-volatile semiconductor memory device as set forth in claim 1, wherein the memory array further comprises the voltage control block that includes an even voltage control unit that is configured to precharge and discharge the even bit lines and an odd voltage control unit that is configured to precharge and discharge the odd bit lines, wherein the even voltage control unit is connected to the upper even bit line and is connected to the lower even bit line through the upper even bit line, and wherein the odd voltage control unit is connected to the lower odd bit line and is connected to the upper odd bit line through the lower odd bit line.

6. The non-volatile semiconductor memory device as set forth in claim 1, wherein the memory array further comprises the voltage control block that includes a high voltage control unit that is configured to precharge the bit lines and a low voltage control unit that is configured to discharge the bit lines, wherein the high voltage control unit is connected to the lower even bit line and the lower odd bit line, and the low voltage control unit is connected to the upper even bit line and the upper odd bit line, wherein the high voltage control unit is connected to the upper even bit line and the upper odd bit line through the lower even bit line and the lower odd bit line, respectively, and wherein the low voltage control unit is connected to the lower even bit line and the lower odd bit line through the upper even bit line and the upper odd bit line, respectively.

7. The non-volatile semiconductor memory device as set forth in claim 1, wherein the memory array further comprises the voltage control block that includes a high voltage control unit that is configured to precharge the bit lines and a low voltage control unit that is configured to discharge the bit lines, wherein the high voltage control unit is connected to the upper even bit line and the upper odd bit line, and the low voltage control unit is connected to the lower even bit line and the lower odd bit line, wherein the high voltage control unit is connected to the lower even bit line and the lower odd bit line through the upper even bit line and the upper odd bit line, respectively, and wherein the low voltage control unit is connected to the upper even bit line and the upper odd bit line through the lower even bit line and the lower odd bit line, respectively.

8. The non-volatile semiconductor memory device as set forth in claim 1, wherein:
   the memory cell array comprises a plurality of first memory cells and a plurality of second memory cells;
   the page buffer is configured to map a set of first to third bits of data to threshold voltage levels of a pair of the first and second memory cells; and
   the first and second memory cells are respectively disposed in a lower even string that is connected to the lower even bit line and an upper even string that is connected to the upper even bit line, or in a lower odd string that is connected to the lower odd bit line and an upper odd string that is connected to the upper odd bit line, the lower even string and the upper even string constituting a pair, and the lower odd string and the upper odd string constituting a pair.

9. The non-volatile semiconductor memory device as set forth in claim 1, wherein the non-volatile semiconductor memory device is a NAND type device.

10. The non-volatile semiconductor memory device as set forth in claim 1, wherein the lower latch block is configured to store lower latch data that can be mapped to a voltage level of the lower common bit line, and wherein the upper latch block is configured to store lower latch data that can be mapped to a voltage level of the lower common bit line.

11. A memory array of a non-volatile semiconductor memory device, the memory array comprising:
   a plurality of non-volatile memory cells;
   a lower even bit line and a lower odd bit line that are selectively connectable to a lower common bit line;
   an upper even bit line and an upper odd bit line that are selectively connectable to an upper common bit line;
   a first switch for electrically connecting the lower even bit line to the upper even bit line in response to a first connection control signal;
   a second switch for electrically connecting the lower odd bit line to the upper odd bit line in response to a second connection control signal; and
   a voltage control unit that is connected to one of the upper even bit line and the lower even bit line to precharge and discharge the upper and the lower even bit lines and connected to one of the upper odd bit line and the lower odd bit line to precharge and discharge the upper and the odd bit lines,
   wherein the lower and the upper even bit lines are electrically connected by the first switch when the voltage control block precharges and discharges the one of the upper and the lower even bit lines and the lower and the upper odd bit lines are electrically connected by the second switch when the voltage control block precharges and discharges the one of the upper and the lower odd bit lines.

12. The memory array as set forth in claim 11, wherein the voltage control unit comprises a first low voltage control unit configured to precharge the upper even bit line and the lower even bit line to a reference voltage source in response to a first control signal.

13. The memory array as set forth in claim 12, further comprising a second low voltage control unit that is configured to discharge the upper odd bit line and the lower odd bit line in response to a second control signal, wherein the second low voltage control unit is coupled to the upper odd bit line and to the lower odd bit line, and wherein a first of the lower odd bit line and the upper odd bit line is connected directly to the second low voltage control unit and a second of the lower odd bit line and the upper odd bit line is connected to the second low voltage control unit through the first of the lower odd bit line and the upper odd bit line.

14. The memory array as set forth in claim 13, wherein the first low voltage control unit comprises a first transistor that selectively connects the upper even bit line and the lower even bit line to a reference voltage source and the second low voltage control unit comprise a second transistor that selectively connects the upper odd bit line and the lower odd bit line to the reference voltage source.

15. The memory array as set forth in claim 14, further comprising a first high voltage control unit that is configured to precharge the upper odd bit line and the lower odd bit line in response to a third control signal, wherein the first high voltage control unit is coupled to the upper odd bit line and to the lower odd bit line, and wherein a first of the lower odd bit line and the upper odd bit line is connected directly to the first high voltage control unit and a second of the lower odd bit line and the upper odd bit line is connected to the first high voltage control unit through the first of the lower odd bit line and the upper odd bit line.

16. The memory array as set forth in claim 15, further comprising a second high voltage control unit that is configured to precharge the upper even bit line and the lower even bit line in response to a fourth control signal, wherein the second high voltage control unit is coupled to the upper even bit line and to the lower even bit line, and wherein a first of the lower even bit line and the upper even bit line is connected directly to the second high voltage control unit and a second of the lower even bit line and the upper even bit line is connected to the second high voltage control unit through the first of the lower even bit line and the upper even bit line.

17. The memory array as set forth in claim 16, wherein the first high voltage control unit comprises a third transistor that selectively connects the upper odd bit line and the lower odd bit line to a supply voltage source, and wherein the second high voltage control unit comprises a fourth transistor that selectively connects the upper even bit line and the lower even bit line to the supply voltage source.

* * * * *